(12) United States Patent
Fujimura et al.

(10) Patent No.: US 9,448,473 B2
(45) Date of Patent: *Sep. 20, 2016

(54) METHOD FOR FRACTURING AND FORMING A PATTERN USING SHAPED BEAM CHARGED PARTICLE BEAM LITHOGRAPHY

(71) Applicant: D2S, Inc., San Jose, CA (US)

(72) Inventors: Akira Fujimura, Saratoga, CA (US); Michael Tucker, Los Altos, CA (US)

(73) Assignee: D2S, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/970,505

(22) Filed: Dec. 15, 2015

(65) Prior Publication Data

US 2016/0103390 A1    Apr. 14, 2016

Related U.S. Application Data

(63) Continuation-in-part of application No. 14/578,410, filed on Dec. 20, 2014, now abandoned, which is a continuation of application No. 13/959,530, filed on Aug. 5, 2013, now Pat. No. 8,916,315, which is a continuation of application No. 13/723,329, filed on Dec. 21, 2012, now Pat. No. 8,501,374, which is a continuation of application No. 13/269,497, filed on Oct. 7, 2011, now Pat. No. 8,343,695, which is a continuation of application No. 12/618,722, filed on Nov. 14, 2009, now Pat. No. 8,039,176, which is a continuation-in-part of application No. 12/603,580, filed on Oct. 21, 2009, now Pat. No. 7,985,514.

(60) Provisional application No. 61/237,290, filed on Aug. 26, 2009.

(51) Int. Cl.
| | | |
|---|---|---|
| G03F 1/70 | (2012.01) |
| G03F 1/78 | (2012.01) |
| G03F 7/20 | (2006.01) |
| G06F 17/50 | (2006.01) |
| H01J 37/317 | (2006.01) |
| B82Y 10/00 | (2011.01) |
| B82Y 40/00 | (2011.01) |
| H01J 37/302 | (2006.01) |

(52) U.S. Cl.
CPC ............... *G03F 1/78* (2013.01); *B82Y 10/00* (2013.01); *B82Y 40/00* (2013.01); *G03F 1/70* (2013.01); *G03F 7/2061* (2013.01); *G06F 17/5045* (2013.01); *G06F 17/5081* (2013.01); *H01J 37/3026* (2013.01); *H01J 37/3174* (2013.01); *Y10S 430/143* (2013.01)

(58) Field of Classification Search
CPC .. G06F 17/5081; G06F 17/5045; G03F 1/78; G03F 1/70; G03F 7/2061; H01J 37/3026; H01J 37/3174; B82Y 40/00; B82Y 10/00; Y10S 430/143

USPC ........ 430/5, 30, 296, 396, 397, 942; 716/53, 716/55
See application file for complete search history.

(56) References Cited

U.S. PATENT DOCUMENTS

| | | |
|---|---|---|
| 3,768,124 A | 10/1973 | Maynard |
| 4,438,336 A | 3/1984 | Riecke |
| 4,634,871 A | 1/1987 | Knauer |
| 4,698,509 A | 10/1987 | Wells et al. |
| 4,818,885 A | 4/1989 | Davis et al. |
| 4,825,033 A | 4/1989 | Beasley |
| 5,082,762 A | 1/1992 | Takahashi |
| 5,103,101 A | 4/1992 | Berglund et al. |
| 5,173,582 A | 12/1992 | Sakamoto et al. |
| 5,334,282 A | 8/1994 | Nakayama et al. |
| 5,723,237 A | 3/1998 | Kobayashi et al. |
| 5,744,810 A | 4/1998 | Satoh |
| 5,825,039 A | 10/1998 | Hartley |
| 5,856,677 A | 1/1999 | Okino |
| 5,885,748 A | 3/1999 | Ohnuma |
| 6,037,601 A | 3/2000 | Okunuki |
| 6,218,671 B1 | 4/2001 | Gordon et al. |

(Continued)

FOREIGN PATENT DOCUMENTS

| | | |
|---|---|---|
| CN | 1193810 A | 9/1998 |
| EP | 1429368 A2 | 6/2004 |

(Continued)

OTHER PUBLICATIONS

Official Letter and Search Report dated Oct. 24, 2014 for Taiwanese Patent Application No. 099134187.
Official Letter and Search Report dated Sep. 25, 2014 for Taiwanese Patent Application No. 099134186.
Official Letter and Search Report dated Sep. 25, 2014 for Taiwanese Patent Application No. 98128360.
Pierrat and Bork, "Impact of Model-Based Fracturing on E-beam Proximity Effect Correction Methodology", Sep. 29, 2010, Proc. of SPIE, vol. 7823, pp. 782313-1-782313-11, Photomask Technology 2010.

(Continued)

*Primary Examiner* — Christopher Young
(74) *Attorney, Agent, or Firm* — The Mueller Law Office, P.C.

(57) ABSTRACT

In the field of semiconductor production using charged particle beam lithography, a method and system for fracturing or mask data preparation or proximity effect correction is disclosed, where a non-circular target pattern to be formed on a surface is input. A plurality of charged particle beam shots for a multi-beam charged particle beam system is determined, where the plurality of shots will form a pattern on the surface, each charged particle beam shot being a multi-beam shot comprising a plurality of circular or nearly-circular beamlets. The pattern on the surface matches the target pattern within a predetermined tolerance. The determining is performed using a computing hardware device.

21 Claims, 14 Drawing Sheets

(56) References Cited

U.S. PATENT DOCUMENTS

| | | |
|---|---|---|
| 6,262,427 B1 | 7/2001 | Gordon |
| 6,291,119 B2 | 9/2001 | Choi et al. |
| 6,372,391 B1 | 4/2002 | Wolfe et al. |
| 6,433,348 B1 | 8/2002 | Abboud et al. |
| 6,525,328 B1 | 2/2003 | Miyoshi et al. |
| 6,557,162 B1 | 4/2003 | Pierrat |
| 6,610,989 B1 | 8/2003 | Takahashi |
| 6,627,366 B2 | 9/2003 | Yang |
| 6,768,124 B2 | 7/2004 | Suzuki et al. |
| 6,815,693 B2 | 11/2004 | Kamijo et al. |
| 6,891,175 B2 | 5/2005 | Hiura |
| 7,150,949 B2 | 12/2006 | Askebjer et al. |
| 7,176,470 B1 | 2/2007 | Evans et al. |
| 7,269,819 B2 | 9/2007 | Hoshino |
| 7,378,668 B2 | 5/2008 | Tanimoto et al. |
| 7,397,053 B2 | 7/2008 | Mizuno |
| 7,449,700 B2 | 11/2008 | Inanami |
| 7,453,063 B2 | 11/2008 | Ottens et al. |
| 7,536,664 B2 | 5/2009 | Cohn et al. |
| 7,550,749 B2 | 6/2009 | Caliendo et al. |
| 7,592,611 B2 | 9/2009 | Kasahara et al. |
| 7,703,069 B1 | 4/2010 | Liu et al. |
| 7,707,541 B2 | 4/2010 | Abrams et al. |
| 7,716,627 B1 | 5/2010 | Ungar et al. |
| 7,745,078 B2 | 6/2010 | Fujimura et al. |
| 7,759,026 B2 | 7/2010 | Fujimura et al. |
| 7,759,027 B2 | 7/2010 | Fujimura et al. |
| 7,901,850 B2 | 3/2011 | Fujimura et al. |
| 7,985,514 B2 | 7/2011 | Fujimura et al. |
| 8,017,286 B2 | 9/2011 | Fujimura et al. |
| 8,017,288 B2 | 9/2011 | Fujimura et al. |
| 8,039,176 B2 | 10/2011 | Fujimura et al. |
| 8,137,871 B2 | 3/2012 | Zable et al. |
| 8,283,094 B2 | 10/2012 | Fujimura et al. |
| 8,343,695 B2 | 1/2013 | Fujimura et al. |
| 8,354,207 B2 | 1/2013 | Fujimura et al. |
| 8,473,875 B2 | 6/2013 | Fujimura et al. |
| 8,501,374 B2 | 8/2013 | Fujimura et al. |
| 8,828,628 B2 | 9/2014 | Fujimura |
| 8,900,778 B2 | 12/2014 | Fujimura et al. |
| 8,916,315 B2 | 12/2014 | Fujimura et al. |
| 2001/0019812 A1 | 9/2001 | Yamaguchi et al. |
| 2002/0005494 A1 | 1/2002 | Kamijo et al. |
| 2002/0020824 A1 | 2/2002 | Itoh |
| 2002/0042009 A1 | 4/2002 | Suzuki |
| 2002/0125444 A1 | 9/2002 | Kojima |
| 2002/0129328 A1 | 9/2002 | Komatsuda |
| 2002/0177056 A1 | 11/2002 | Ogino et al. |
| 2003/0043358 A1 | 3/2003 | Suganuma et al. |
| 2003/0044703 A1 | 3/2003 | Yamada |
| 2003/0059716 A1 | 3/2003 | Simizu |
| 2003/0077530 A1 | 4/2003 | Fujiwara et al. |
| 2003/0082461 A1 | 5/2003 | Carpi |
| 2003/0087191 A1 | 5/2003 | Lavallee et al. |
| 2003/0159125 A1 | 8/2003 | Wang et al. |
| 2003/0203287 A1 | 10/2003 | Miyagawa |
| 2004/0011966 A1 | 1/2004 | Sasaki et al. |
| 2004/0099636 A1 | 5/2004 | Scipioni |
| 2004/0131977 A1 | 7/2004 | Martyniuk et al. |
| 2004/0229133 A1 | 11/2004 | Socha et al. |
| 2005/0053850 A1 | 3/2005 | Askebjer et al. |
| 2005/0076322 A1 | 4/2005 | Ye et al. |
| 2005/0091632 A1 | 4/2005 | Pierrat et al. |
| 2005/0097500 A1 | 5/2005 | Ye et al. |
| 2005/0211921 A1 | 9/2005 | Wieland et al. |
| 2005/0221204 A1 | 10/2005 | Kimura |
| 2006/0085773 A1 | 4/2006 | Zhang |
| 2006/0126046 A1 | 6/2006 | Hansen |
| 2006/0218520 A1 | 9/2006 | Pierrat et al. |
| 2007/0023703 A1 | 2/2007 | Sunaoshi et al. |
| 2007/0114463 A1 | 5/2007 | Nakasugi et al. |
| 2007/0196768 A1 | 8/2007 | Ogino |
| 2007/0263921 A1 | 11/2007 | Nakasugi et al. |
| 2007/0280526 A1 | 12/2007 | Malik et al. |
| 2008/0050676 A1 | 2/2008 | Hoshino |
| 2008/0054196 A1 | 3/2008 | Hiroshima |
| 2008/0116398 A1 | 5/2008 | Hara et al. |
| 2008/0203324 A1 | 8/2008 | Fujimura et al. |
| 2009/0200495 A1 | 8/2009 | Platzgummer |
| 2009/0325085 A1 | 12/2009 | Yoshida et al. |
| 2010/0055580 A1 | 3/2010 | Fujimura et al. |
| 2010/0055585 A1 | 3/2010 | Fujimura et al. |
| 2010/0058279 A1 | 3/2010 | Fujimura et al. |
| 2010/0058282 A1 | 3/2010 | Fujimura et al. |
| 2010/0148087 A1 | 6/2010 | Doering et al. |
| 2010/0183963 A1 | 7/2010 | Zable et al. |
| 2010/0209834 A1 | 8/2010 | Yao et al. |
| 2010/0227200 A1 | 9/2010 | Miyata et al. |
| 2010/0251202 A1 | 9/2010 | Pierrat |
| 2010/0264335 A1 | 10/2010 | Hoyle et al. |
| 2010/0315611 A1 | 12/2010 | Kato |
| 2010/0325595 A1 | 12/2010 | Song et al. |
| 2011/0033788 A1 | 2/2011 | Kato |
| 2011/0053056 A1 | 3/2011 | Fujimura et al. |
| 2011/0053093 A1 | 3/2011 | Hagiwara et al. |
| 2011/0116067 A1 | 5/2011 | Ye et al. |
| 2011/0145769 A1 | 6/2011 | Wei |
| 2011/0159435 A1 | 6/2011 | Zable et al. |
| 2011/0177458 A1 | 7/2011 | Kotani et al. |
| 2012/0096412 A1 | 4/2012 | Fujimura et al. |
| 2012/0149133 A1 | 6/2012 | Parrish et al. |
| 2012/0151428 A1 | 6/2012 | Tanaka et al. |
| 2012/0217421 A1 | 8/2012 | Fujimura et al. |
| 2012/0329289 A1 | 12/2012 | Fujimura et al. |
| 2013/0070222 A1 | 3/2013 | Fujimura |
| 2013/0283216 A1 | 10/2013 | Pearman et al. |
| 2013/0283218 A1 | 10/2013 | Fujimura et al. |
| 2015/0106772 A1 | 4/2015 | Fujimura et al. |

FOREIGN PATENT DOCUMENTS

| | | |
|---|---|---|
| EP | 2302659 A2 | 3/2011 |
| GB | 2367908 | 4/2002 |
| JP | S5425675 A | 2/1979 |
| JP | S54025675 | 2/1979 |
| JP | S608844 A | 1/1985 |
| JP | 61105839 | 5/1986 |
| JP | 63007631 | 1/1988 |
| JP | H02280315 A | 11/1990 |
| JP | 03205815 | 9/1991 |
| JP | H03205815 A | 9/1991 |
| JP | 04196516 | 7/1992 |
| JP | 4196516 A | 7/1992 |
| JP | H04196516 A | 7/1992 |
| JP | H04307723 A | 10/1992 |
| JP | 05036595 | 2/1993 |
| JP | H0536595 A | 2/1993 |
| JP | H05036595 | 2/1993 |
| JP | 05267133 | 10/1993 |
| JP | H05267133 A | 10/1993 |
| JP | H05335221 A | 12/1993 |
| JP | H0620931 A | 1/1994 |
| JP | H06020931 | 1/1994 |
| JP | 06124883 | 5/1994 |
| JP | 08055771 | 2/1996 |
| JP | 8555771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09266153 A | 10/1997 |
| JP | 10294255 | 11/1998 |
| JP | H11111594 A | 4/1999 |
| JP | 11233401 | 8/1999 |
| JP | 2000012426 A | 1/2000 |
| JP | 2000091191 A | 3/2000 |
| JP | 2000123768 A | 4/2000 |
| JP | 2000138165 A | 5/2000 |
| JP | 2000269123 | 9/2000 |
| JP | 2001013671 A | 1/2001 |
| JP | 2001093809 A | 4/2001 |
| JP | 2001203157 A | 7/2001 |
| JP | 2001230203 A | 8/2001 |

(56) References Cited

FOREIGN PATENT DOCUMENTS

| | | |
|---|---|---|
| JP | 2001305720 A | 11/2001 |
| JP | 2001313253 A | 11/2001 |
| JP | 2002008966 | 1/2002 |
| JP | 2002075830 A | 3/2002 |
| JP | 2002110508 A | 4/2002 |
| JP | 2002202590 A | 7/2002 |
| JP | 2002217092 A | 8/2002 |
| JP | 2003195511 A | 7/2003 |
| JP | 2003315976 A | 11/2003 |
| JP | 2003338460 A | 11/2003 |
| JP | 2003347192 A | 12/2003 |
| JP | 2004063546 | 2/2004 |
| JP | 2004088071 A | 3/2004 |
| JP | 2004134447 A | 4/2004 |
| JP | 2004170410 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2006032814 A | 2/2006 |
| JP | 2006059348 A | 3/2006 |
| JP | 2006100336 A | 4/2006 |
| JP | 2006108447 A | 4/2006 |
| JP | 2006222230 A | 8/2006 |
| JP | 2006294794 A | 10/2006 |
| JP | 2007041090 A | 2/2007 |
| JP | 2007103923 A | 4/2007 |
| JP | 2007242710 A | 9/2007 |
| JP | 2007249167 | 9/2007 |
| JP | 2007305880 A | 11/2007 |
| JP | 2008053565 A | 3/2008 |
| JP | 2008066441 A | 3/2008 |
| JP | 2008096486 A | 4/2008 |
| JP | 2009147254 A | 7/2009 |
| JP | 2010062562 A | 3/2010 |
| JP | 2011040716 A | 2/2011 |
| JP | 2011049556 | 3/2011 |
| KR | 20030091754 | 12/2003 |
| KR | 1020070082031 | 8/2007 |
| TW | 495834 B | 7/2002 |
| TW | I222100 B | 10/2004 |
| TW | I233149 B | 5/2005 |
| TW | 200523524 A | 7/2005 |
| TW | 200604763 A | 2/2006 |
| TW | 200606602 | 2/2006 |
| TW | 200700932 | 1/2007 |
| TW | 200832080 A | 8/2008 |
| TW | 200834366 A | 8/2008 |
| TW | 200900880 A | 1/2009 |
| WO | 03036386 A | 5/2003 |
| WO | 2007030528 A2 | 3/2007 |
| WO | 2008064155 A | 5/2008 |
| WO | 2010025031 A2 | 3/2010 |
| WO | 2010025060 A2 | 3/2010 |
| WO | 2010025061 A2 | 3/2010 |

OTHER PUBLICATIONS

Pierrat et al, Mask Data Correction Methodology in the Context of Model-Based Fracturing and Advanced Mask Models, Optical Microlithography XXIV, SPIE, vol. 7973, No. 1, Mar. 2011, pp. 1-11.
Quickle et al., Spot Overlap in a Variable Shaped Shpot Electroni Beam Exposure Tool, IP.com Journal, IP.com Inc., West Henrietta, NY, USA, Jun. 1, 1981 pp. 1-3.
Sakakibara et al., Variable-shaped Electron-Beam Direct Writing Technology for 1-Mum VSI Fabrication, IEEE Transations on Electron Devices, IEEE Service Center, New Jersey, US, vol. 28, No. 11, Nov. 1, 1981, pp. 1279-1284.
Search Report dated Apr. 9, 2014 for Taiwanese Application No. 98128358.
Search Report dated Dec. 24, 2015 for Taiwanese Patent Application No. 101134276.
U.S. Appl. No. 61/237,290, filed Aug. 26, 2009, titled "Method and System for Manufacturing a Surface Using Charged Particle Beam Lithography", Hagiwara et al.
Yamada, A. et al., "Variable cell projection as an advance in electron-beam cell projection system", Journal of Vacuum Science Technology, B 22(6) (Dec. 2004), pp. 2917-2922, American Vacuum Society, 125 Maiden Lane, 15th Floor, New York, NY 10038.
Office Action dated Jan. 20, 2015 for Japanese Patent Application No. 2012-535223.
Office Action dated Jan. 31, 2013 for U.S. Appl. No. 13/631,941.
Office Action dated Jan. 6, 2015 for Japanese Patent Application No. 2010-183857.
Office Action dated Jul. 8, 2011 for U.S. Appl. No. 12/898,646.
Office Action dated Jul. 15, 2014 for U.S. Appl. No. 13/037,270.
Office Action dated Jul. 27, 2015 for U.S. Appl. No. 14/331,008.
Office Action dated Jul. 8, 2014 for Japanese Patent Application No. 2009-200191.
Office Action dated Jul. 8, 2015 for U.S. Appl. No. 14/479,520.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 12, 2013 for U.S. Appl. No. 13/631,941.
Office Action dated Jun. 15, 2015 for U.S. Appl. No. 14/578,410.
Office Action dated Jun. 19, 2015 for U.S. Appl. No. 13/862,471.
Office Action dated Jun. 25, 2015 for U.S. Appl. No. 14/552,360.
Office Action dated Jun. 3, 2014 for Japanese Patent Application No. 2012-535220.
Office Action dated Jun. 6, 2014 for U.S. Appl. No. 13/329,315.
Office Action dated Mar. 13, 2014 for U.S. Appl. No. 13/862,476.
Office Action dated Mar. 27, 2015 for U.S. Appl. No. 14/454,140.
Office Action dated Mar. 3, 2015 for Japanese Patent Application No. 2011-525090.
Office Action dated Mar. 30, 2012 for U.S. Appl. No. 12/898,646.
Office Action dated May 9, 2014 for U.S. Appl. No. 14/106,584.
Office Action dated May 1, 2014 for U.S. Appl. No. 13/862,471.
Office Action dated May 12, 2015 for Korean Patent Application No. 10-2014-7036547.
Office Action dated May 13, 2014 for Japanese Patent Application No. 2010-183857.
Office Action dated May 16, 2014 for U.S. Appl. No. 13/948,725.
Office Action dated May 27, 2014 for Japanese Patent Application No. 2012-535223.
Office Action dated May 5, 2014 for U.S. Appl. No. 13/862,475.
Office Action dated Oct. 15, 2014 for U.S. Appl. No. 13/862,476.
Office Action dated Oct. 20, 2014 for U.S. Appl. No. 13/862,471.
Office Action dated Oct. 20, 2015 for U.S. Appl. No. 14/454,140.
Office Action dated Oct. 24, 2014 for U.S. Appl. No. 14/106,584.
Office Action dated Oct. 25, 2013 for U.S. Appl. No. 13/037,263.
Office Action dated Oct. 26, 2011 for U.S. Appl. No. 12/898,646.
Office Action dated Oct. 29, 2013 for U.S. Appl. No. 13/037,270.
Office Action dated Oct. 6, 2014 for U.S. Appl. No. 14/331,008.
Office Action dated Oct. 6, 2015 for Japanese Patent Application No. 2013-556643.
Office Action dated Sep. 10, 2013 for U.S. Appl. No. 13/329,314.
Office Action dated Sep. 11, 2015 for U.S. Appl. No. 14/739,989.
Office Action dated Sep. 11, 2015 for U.S. Appl. No. 14/177,688.
Office Action dated Sep. 15, 2015 for Japanese Patent Application No. 2014-245829.
Office Action dated Sep. 21, 2015 for U.S. Appl. No. 14/177,679.
Office Action dated Sep. 24, 2013 for U.S. Appl. No. 13/329,315.
Office Action dated Sep. 29, 2015 for U.S. Appl. No. 14/715,136.
Official Letter and Search Report dated Apr. 10, 2015 for Taiwanese Patent Application No. 98128034.
Official Letter and Search Report dated Apr. 13, 2015 for Taiwanese Patent Application No. TW 100136720.
Official letter and search report dated Apr. 29, 2015 for Taiwanese Application No. 99127100.
Official Letter and Search Report dated Aug. 21, 2014 for Taiwanese Patent Application No. 098128359.

(56) References Cited

OTHER PUBLICATIONS

Official letter and search report dated Aug. 6, 2014 for Taiwanese Patent Application No. 099127553.
Official Letter and Search Report dated Oct. 21, 2015 for Taiwanese Patent Application 101122222.
Chinese Office Action dated Sep. 11, 2013 for Chinese Application No. 200980134188.6.
European Search Report dated Nov. 17, 2015 for EP Patent Application No. 09810441.7.
Extended European Search report dated Apr. 28, 2011 for EPO Application No. 10173794.8.
Extended European Search Report dated Jul. 20, 2015 for European Patent Application No. 12833285.5.
Extended European Search Report dated Jul. 23, 2015 for European Patent Application No. 12804558.0.
Hagiwara et al., Model-Based Mask Data Preparation (MB-MDP) for ArF and EUV Mask Process Correction, Photomask and Next-Generation Lithography Mask Technology XVIII, SPIE, vol. 8081, No. 1, Apr. 2011, pp. 1-8.
Hara, S. et al., "Character Projection EB Data Conversion System Combined with Throughput Analyzer", Japanese Journal of Applied Physics, vol. 33 (Dec. 1994), pp. 6935-6939, Japan Society of Applied Physics, Kudan-Kita building 5th floor, Kudan-Kita 1-12-3, Chiyoda-ku, Tokyo 102-0073, Japan.
Hattori, K. et al., "Electron Beam Direct Writing System EX-8D Employing Character Projection Exposure Method", Journal of Vacuum Science Technology, vol. B11(6) (Nov./Dec. 1993), pp. 2346-2351, 1993, American Vacuum Society, 125 Maiden Lane, 15th Floor, New York, NY 10038.
International Search Report and Written Opinion dated Dec. 29, 2010 for application PCT/US2010/051534.
International Search Report and Written Opinion dated Dec. 3, 2010 for PCT/US2010/046559.
International Search Report and Written Opinion for International Application No. PCT/US2010/051393 dated May 30, 2011.
Japanese Office Action dated Aug. 20, 2013 for Japanese Patent Application No. 2011-525071.
Japanese Office Action dated Oct. 1, 2013 for Japanese Patent Application No. 2011-525090.
Japanese Office Action dated Oct. 8, 2013 for Japanese Patent Application No. 2011-525091.
Nishimura, S. et al. "Development of a mask-scan electron beam mask writer", Journal of Vacuum Science & Technology B (Microelectronics and Nanometer Structures). vol. 20, No. 6, Nov. 1, 2002, pp. 2640-2645 XP002632946.
Notice of Allowance and Fee(s) dated Oct. 11, 2013 for U.S. Appl. No. 13/923,368.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Aug. 23, 2013 for U.S. Appl. No. 13/723,181.
Notice of Allowance and Fees dated Dec. 26, 2013 for U.S. Appl. No. 13/862,472.
Notice of Allowance and Fees dated Feb. 9, 2015 for U.S. Appl. No. 13/037,270.
Notice of Allowance and Fees dated Jan. 21, 2015 for U.S. Appl. No. 14/257,874.
Notice of Allowance and Fees dated Jan. 23, 2015 for U.S. Appl. No. 13/862,476.
Notice of Allowance and Fees dated Jan. 26, 2015 for U.S. Appl. No. 14/106,584.
Notice of Allowance and Fees dated Jul. 23, 2014 for U.S. Appl. No. 13/970,465.
Notice of Allowance and Fees dated Jun. 23, 2015 for U.S. Appl. No. 14/578,060.
Notice of Allowance and Fees dated Mar. 20, 2014 for U.S. Appl. No. 13/970,465.
Notice of Allowance and Fees dated Mar. 27, 2015 for U.S. Appl. No. 13/948,725.
Notice of Allowance and Fees dated Oct. 10, 2014 for U.S. Appl. No. 13/801,554.
Notice of Allowance and Fees dated Oct. 14, 2015 for U.S. Appl. No. 14/552,360.
Notice of Allowance and Fees Due dated Dec. 28, 2012 for U.S. Appl. No. 12/862,741.
Notice of Allowance and Fees Due dated Jun. 1, 2012 for U.S. Appl. No. 13/274,346.
Notice of Allowance dated Dec. 24, 2015 for U.S. Appl. No. 14/177,679.
Notice of Allowance dated Jan. 25, 2016 for U.S. Appl. No. 14/177,688.
Notice of Allowance dated Oct. 23, 2015 for U.S. Appl. No. 14/479,520.
Notice of Allowance mailed Jan. 20, 2016 for U.S. Appl. No. 14/331,008.
Notice of Allowance mailed on Mar. 22, 2011 for U.S. Appl. No. 12/603,580.
Office Action dated Apr. 15, 2014 for Japanese Patent Application No. 2011-525072.
Office Action dated Apr. 3, 2014 for Chinese patent application No. 200980134188.6.
Office Action dated Aug. 18, 2015 for Japanese Patent Application No. 2014-248818.
Office Action dated Aug. 20, 2015 for U.S. Appl. No. 13/862,475.
Office Action dated Aug. 22, 2012 for U.S. Appl. No. 12/862,741.
Office Action dated Aug. 5, 2014 for Japanese Patent Application No. 2011-525091.
Office Action dated Dec. 16, 2015 for Republic of Korea Patent Application No. 10-2011-7007511.
Office Action dated Dec. 21, 2015 for Republic of Korea Patent Application No. 10-2014-7036547.
Office Action dated Feb. 14, 2014 for U.S. Appl. No. 13/631,941.
Office Action dated Feb. 27, 2014 for U.S. Appl. No. 13/236,610.
Office Action dated Feb. 6, 2015 for U.S. Appl. No. 13/862,475.
Office Action dated Jan. 11, 2016 for Republic of Korea Patent Application No. 10-2011-7007654.
Office Action dated Jan. 15, 2016 for Republic of Korea Patent Application No. 10-2009-0081187.
Pierrat and Bork, Impact of Model-Based Fracturing on E-beam Proximity Effect Correction Methodology, Proc. of SPIE vol. 7823, 782313, Sep. 2010 SPIE, 11 pages.
Leunissen et al., Experimental and simulation comparison of electron-beam proximity correction, Journal of Vacuum Science & Technology B 22(6), Nov. 2004, pp. 2943-2947.
Notice of Allowance dated Feb. 22, 2016 for U.S. Appl. No. 14/809,188.
Notice of Allowance dated Mar. 18, 2016 for U.S. Appl. No. 13/862,475.
Office Action dated Apr. 20, 2016 for U.S. Appl. No. 14/715,136.
Office Action dated Apr. 22, 2016 for U.S. Appl. No. 14/454,140.
Office Action dated Apr. 26, 2016 for Japanese Patent Application No. 2014-517074.
Office Action dated Feb. 11, 2016 for U.S. Appl. No. 13/862,471.
Office Action dated May 1, 2016 for Republic of Korea Patent Application No. 10-2010-0083145.
Office Action dated May 3, 2016 for U.S. Appl. No. 15/068,516.

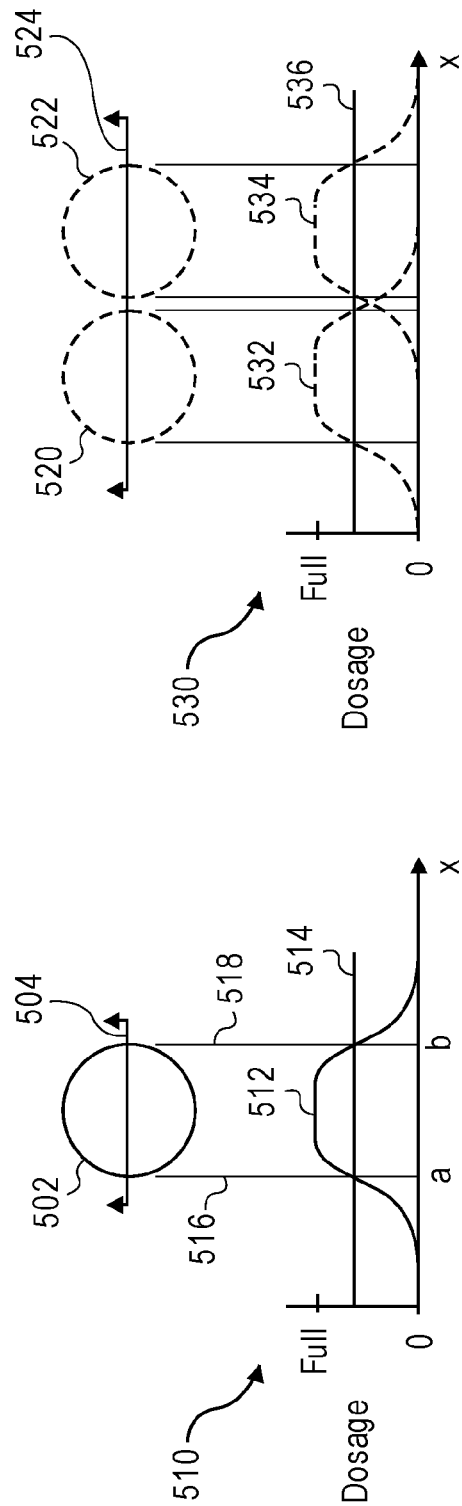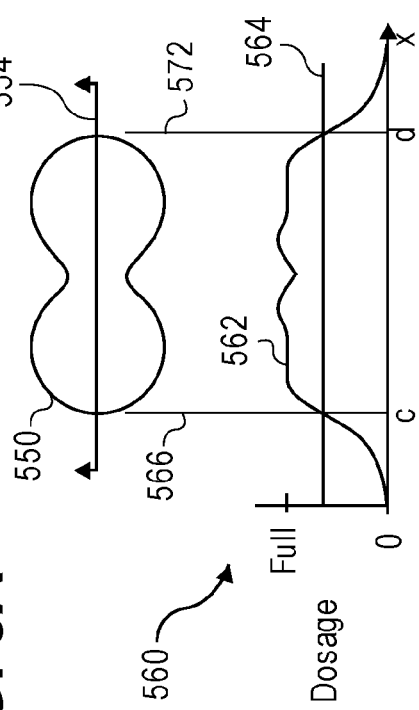

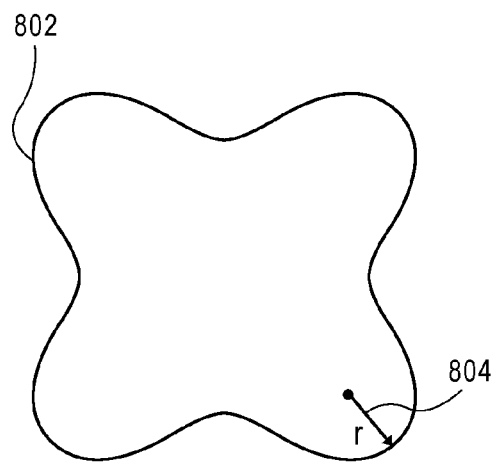
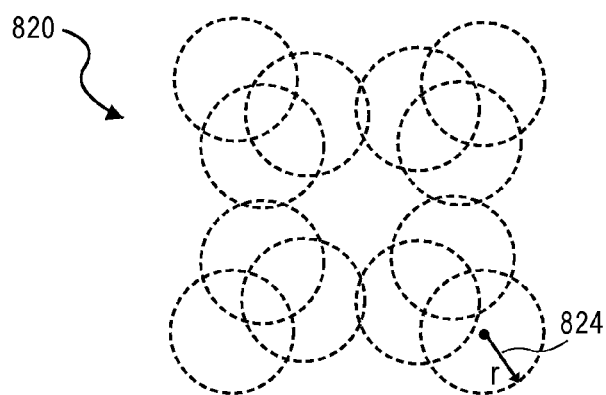
FIG. 8A            FIG. 8B
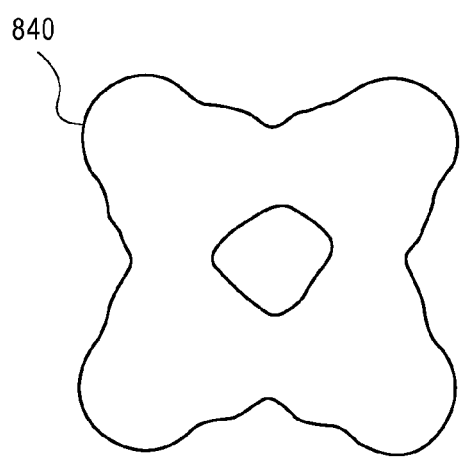
FIG. 8C

METHOD FOR FRACTURING AND FORMING A PATTERN USING SHAPED BEAM CHARGED PARTICLE BEAM LITHOGRAPHY

RELATED APPLICATIONS

This application is 1) a continuation-in-part of U.S. patent application Ser. No. 14/578,410 entitled "Method For Fracturing And Forming A Pattern Using Shaped Beam Charged Particle Beam Lithography" filed on Dec. 20, 2014; 2) which is a continuation of U.S. patent application Ser. No. 13/959,530 entitled "Method For Fracturing And Forming A Pattern Using Shaped Beam Charged Particle Beam Lithography," filed on Aug. 5, 2013 and issued as U.S. Pat. No. 8,916,315; 3) which is a continuation of U.S. patent application Ser. No. 13/723,329 entitled "Method For Fracturing And Forming A Pattern Using Shaped Beam Charged Particle Beam Lithography," filed on Dec. 21, 2012 and issued as U.S. Pat. No. 8,501,374; 4) which is a continuation of U.S. patent application Ser. No. 13/269,497 entitled "Method For Fracturing And Forming A Pattern Using Curvilinear Characters With Charged Particle Beam Lithography," filed on Oct. 7, 2011 and issued as U.S. Pat. No. 8,343,695; all of which are hereby incorporated by reference for all purposes. U.S. patent application Ser. No. 13/269,497: 5) is a continuation of U.S. patent application Ser. No. 12/618,722 entitled "Method For Fracturing and Forming a Pattern Using Curvilinear Characters With Charged Particle Beam Lithography," filed on Nov. 14, 2009 and issued as U.S. Pat. No. 8,039,176; 6) which is a continuation-in-part of U.S. patent application Ser. No. 12/603,580 entitled "Method For Fracturing A Pattern For Writing With A Shaped Charged Particle Beam Writing System Using Dragged Shots," filed on Oct. 21, 2009 and issued as U.S. Pat. No. 7,985,514; and 7) which claims priority from U.S. Provisional Patent Application Ser. No. 61/237,290 filed on Aug. 26, 2009, entitled "Method and System For Manufacturing a Surface Using Charged Particle Beam Lithography"; all of which are hereby incorporated by reference for all purposes.

BACKGROUND OF THE DISCLOSURE

The present disclosure is related to lithography, and more particularly to the design of a charged particle beam writer system and methods for using the charged particle beam writer system to manufacture a surface which may be a reticle, a wafer, or any other surface.

In the production or manufacturing of semiconductor devices, such as integrated circuits, optical lithography may be used to fabricate the semiconductor devices. Optical lithography is a printing process in which a lithographic mask or photomask or reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this disclosure. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At pre-determined locations, doses of electrons are shot into the resist with these simple shapes. The total writing time for this type of system increases with the number of shots. In CP, there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45 degree right triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce on the substrate the original circuit design by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs is less than that for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the surface as input. ILT-computed reticle patterns may be purely curvilinear—i.e. completely non-rectilinear—and may include circular, nearly circular, annular, nearly annular, oval and/or nearly oval patterns. Since curvilinear patterns are difficult and expensive to form on a reticle using conventional techniques, rectilinear approximations of the curvilinear patterns may be used. In this disclosure ILT, OPC, source mask optimization (SMO), and computational lithography are terms that are used interchangeably.

There are a number of technologies used for forming patterns on a reticle, including using optical lithography or charged particle beam systems. Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam system, allowing the creation of more accurate photomasks. When using VSB, the total writing time for the system increases with the number of shots. A second type of system that can be used for forming patterns on a reticle is a character projection system, which has been described above.

The cost of charged particle beam lithography is directly related to the time required to expose a pattern on a surface, such as a reticle or wafer. Conventionally, the exposure time is related to the number of shots required to produce the pattern. For the most complex integrated circuit designs, forming the set of layer patterns, either on a set of reticles or on a substrate, is a costly and time-consuming process. It would therefore be advantageous to be able to reduce the time required to form complex patterns, such as curvilinear patterns, on a reticle and other surfaces, such as by reducing the number of shots required to form these complex patterns.

SUMMARY OF THE DISCLOSURE

A method and system for fracturing or mask data preparation or proximity effect correction is disclosed, where a non-circular target pattern to be formed on a surface is input. A plurality of charged particle beam shots for a multi-beam charged particle beam system is determined, where the plurality of shots will form a pattern on the surface, each charged particle beam shot being a multi-beam shot comprising a plurality of circular or nearly-circular beamlets. The pattern on the surface matches the target pattern within a predetermined tolerance. The determining is performed using a computing hardware device.

A method for manufacturing a surface using charged particle beam lithography is also disclosed, where a non-circular target pattern to be formed on a surface is input. A plurality of charged particle beam shots for a multi-beam charged particle beam system is determined, where the plurality of shots will form a pattern on the surface, each charged particle beam shot being a multi-beam shot comprising a plurality of circular or nearly-circular beamlets. The pattern on the surface matches the target pattern within a predetermined tolerance. The pattern is formed on the surface with the plurality of shots.

BRIEF DESCRIPTION OF THE DRAWINGS

FIG. 5A illustrates a pattern and a cross-sectional dosage curve produced by a single circular CP shot;

FIG. 5B illustrates two proximate, individually-calculated patterns and dosages curves similar to the pattern and dosage curve of FIG. 5A;

FIG. 5C illustrates a pattern and a cross-sectional dosage graph of a pair of proximate circular CP shots;

FIG. 8A illustrates an example of a curvilinear target pattern;

FIG. 8B illustrates a series of circular CP shots which can form the perimeter of the pattern of FIG. 8A;

FIG. 8C illustrates the pattern formed by the set of perimeter shots in FIG. 8B;

DETAILED DESCRIPTION OF THE EMBODIMENTS

The present disclosure describes generating and exposing a plurality of curvilinear shots or multi-beam beamlets, to form a non-circular pattern on a surface. The plurality of shots or beamlets may be written in any temporal order, including simultaneously.

Figure 1:
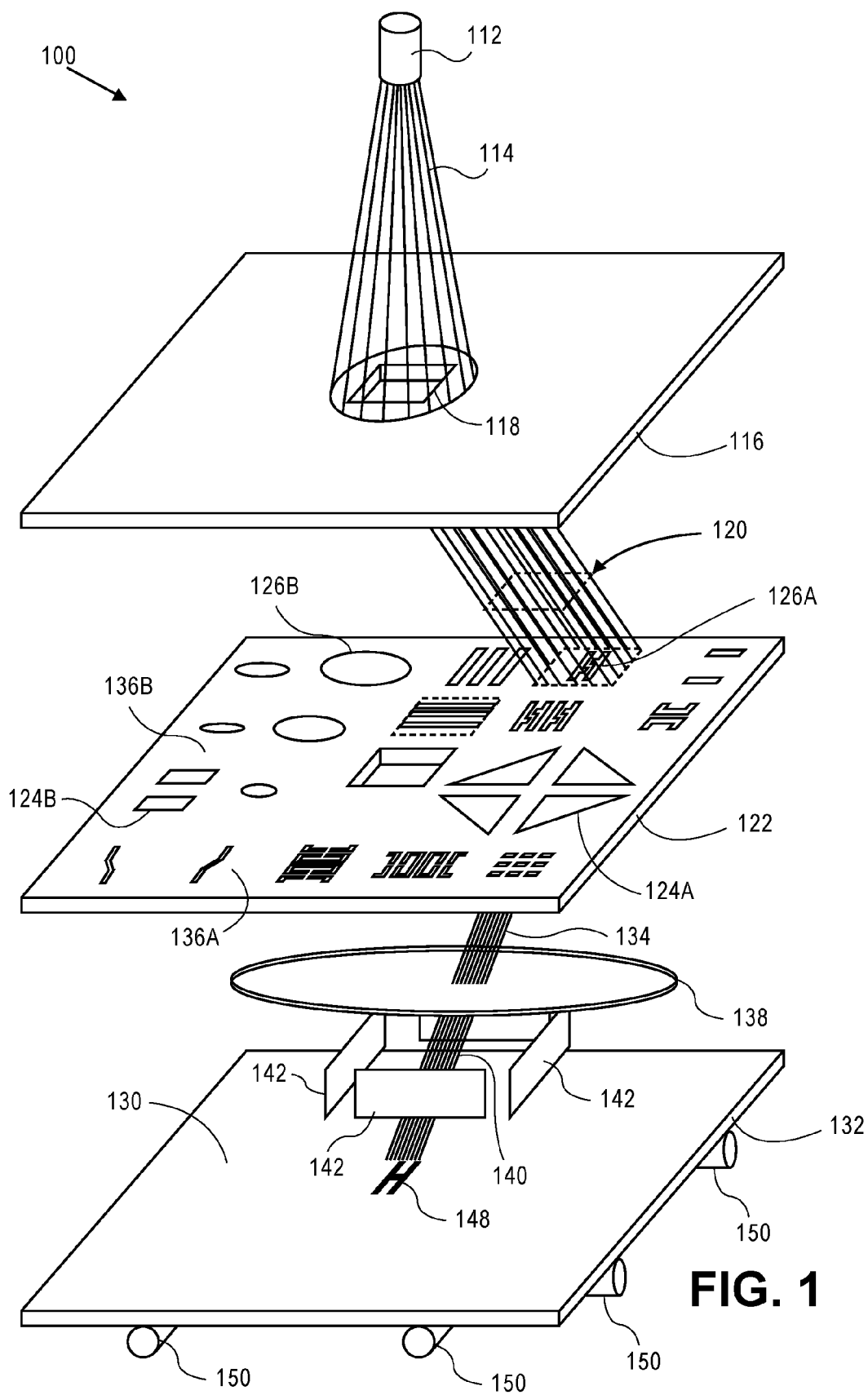
FIG. 1 illustrates a character projection charged particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126A. The pattern 148 is reduced in size compared to the character 126A because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142. Because of this, patterns are normally written on the surface in a series of stripes. Each stripe contains a plurality of sub-fields, where a sub-field is within the beam deflection capability of the deflection plates 142. The electron beam writer system 100 contains a positioning mechanism 150 to allow positioning the substrate 132 for each of the stripes and sub-fields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved.

The minimum size pattern that can be projected with reasonable accuracy onto a surface 130 is limited by a variety of short-range physical effects associated with the electron beam writer system 100 and with the surface 130, which normally comprises a resist coating on the substrate 132. These effects include forward scattering, Coulomb effect, and resist diffusion. Beam blur is a term used to include all of these short-range effects. The most modern electron beam writer systems can achieve an effective beam blur in the range of 20 nm to 30 nm. Forward scattering may constitute one quarter to one half of the total beam blur. Modern electron beam writer systems contain numerous mechanisms to reduce each of the constituent pieces of beam blur to a minimum. Some electron beam writer systems may allow the beam blur to be varied during the writing process, from the minimum value available on an electron beam writing system to one or more larger values.

Figure 2:
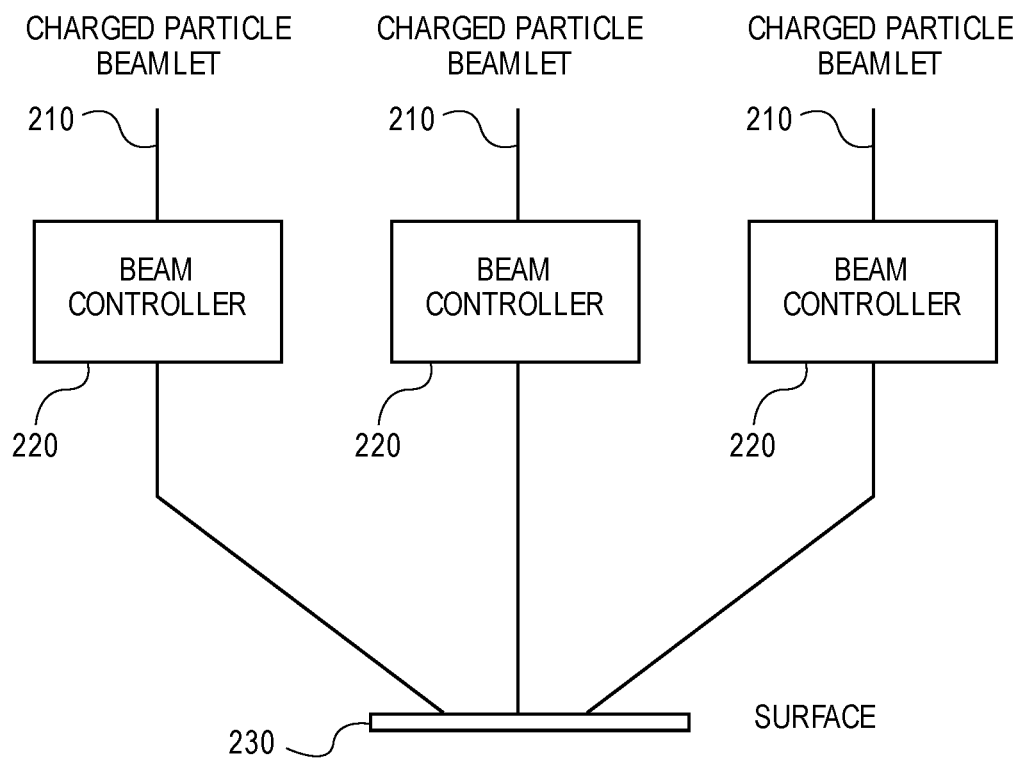
FIG. 2 illustrates an example of an electro-optical schematic diagram of a multi-beam exposure system.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Each beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230, which will typically be coated with a resist. In some embodiments each beamlet may have a separate electro-optical lens, while in other embodiments a plurality of beamlets, including possibly all beamlets, will share an electro-optical lens.

Figure 3A:
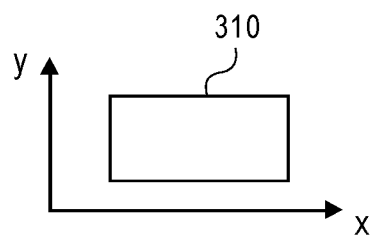
FIG. 3A illustrates an example of a rectangular shot.
Figure 3B:
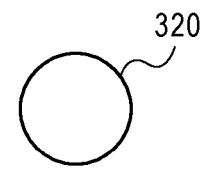
FIG. 3B illustrates an example of a circular character projection shot.
Figure 3C:
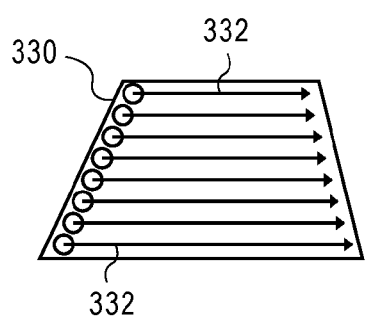
FIG. 3C illustrates an example of a trapezoidal shot.
Figure 3D:
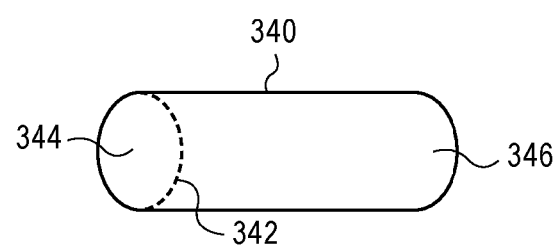
FIG. 3D illustrates an example of a dragged shot.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIG. 3 illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

Figure 3E:
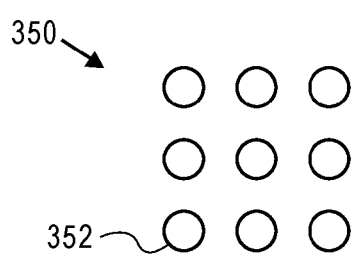
FIG. 3E illustrates an example of a shot which is an array of circular patterns.
Figure 3F:
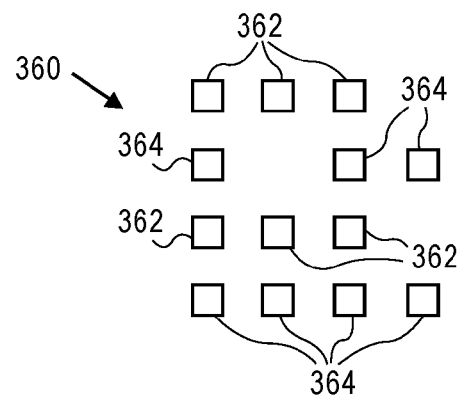
FIG. 3F illustrates an example of a shot which is a sparse array of rectangular patterns.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
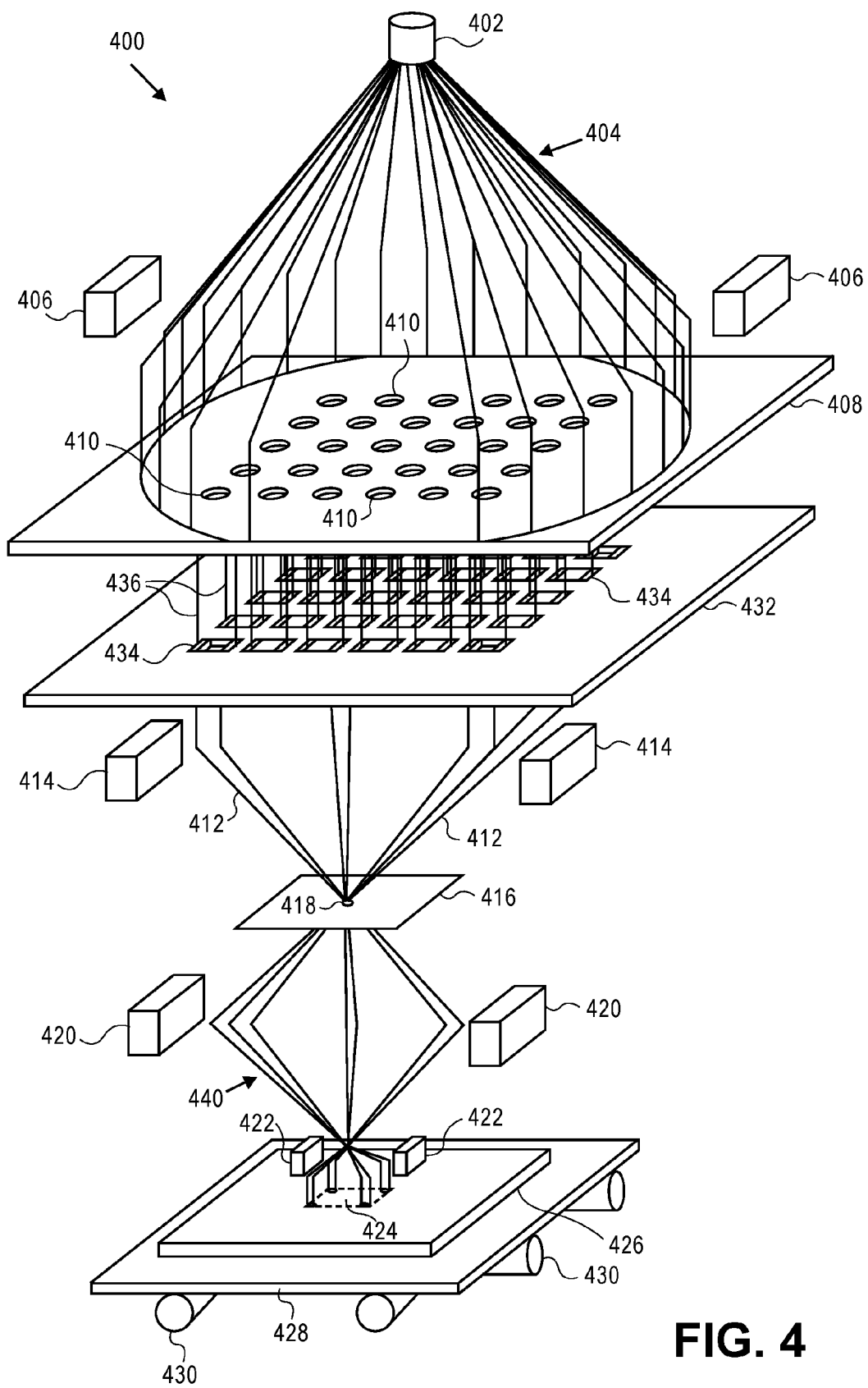
FIG. 4 illustrates an example of a multi-beam charged particle beam system.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. Thus, the multi-beam charged particle beam system 400 comprises the charged particle beam source 402 and aperture plate 408, where the aperture plate 408 comprises a plurality of apertures 410 which the charged particle beam 402 source illuminates. In some embodiments, the multi-beam charged particle beam system comprises a single aperture plate 410. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be circular as shown in FIG. 4, or may be of a different shape, for example rectangular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that matches a pattern of a subset of apertures 410, the subset being those apertures 410 for which corresponding blanking controllers 434 allow beamlets 436 to strike surface 424. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets.

FIG. 5A illustrates an example of a pattern 502 which would be formed on a resist-coated surface by a shot using a circular CP character. Pattern 502 is called a shot outline, which is the pattern that can be formed by the dosage from a single shot. In this disclosure, a shot may refer to a shot made by a charged particle beam system using a single beam, a multi-beam exposure of multiple simultaneous beamlets, or a beamlet of a multi-beam charged particle beam writer. Throughout this disclosure, a pattern which is a shot outline may be referred to as a shot, meaning the shot which can form the shot outline. Dosage graph 510 illustrates the dosage 512 registered along a line 504 through pattern 502, this dosage being called the cross-sectional dosage. As can be seen from dosage curve 512, a predetermined "full" dosage is registered only in the middle part of pattern 502. Also shown in dosage graph 510 is the resist threshold 514. The resist will register as a pattern on the surface only those areas which receive dosages above the resist threshold 514. The dosage curve 512 intersects the threshold 514 at X-coordinates "a" and "b". The X-coordinate "a" is therefore the minimum X-coordinate that will be registered by the resist along line 504, as shown by connector 516. Similarly, the X-coordinate "b" is the maximum X-coordinate that will be registered by the resist along line 504, as shown by connector 518.

FIG. 5B illustrates an example of two shots in close proximity. Dashed line pattern 520 is the shot outline of a circular CP character shot. Dashed line pattern 522 is the shot outline of another circular CP character shot. The dosage graph 530 illustrates two dosage curves. Dosage curve 532 shows the cross-sectional dosage of shot outline 520, as measured along a line 524. Dosage curve 534 shows the cross-sectional dosage of shot outline 522, as measured along the line 524. Also shown on dosage graph 530 is the resist threshold 536. As can be seen from dosage graph 530, the dosage curve 532 and dosage curve 534 overlap, indicating that for some X-coordinates along line 524, the shots associated with both shot outline 520 and shot outline 522 will contribute a measurable dosage. In cases where shot dosage curves overlap, the total dosage reaching the resist-covered surface is the combination, such as by addition, of the dosages from all shots corresponding to the overlapping curves. FIG. 5C illustrates a dosage graph 560 which shows the combined dosage curve 562 for shot outline 520 and shot outline 522 of FIG. 5B. As can be seen, the combined dosage curve 562, which shows the dosage along line 524, shows a dosage that is above the threshold 564 at all X-coordinates between "c" and "d". Pattern 550 shows the pattern that will be formed on the resist-covered surface by the two proximate shots which are associated with shot outline 520 and shot outline 522. The cross sectional dosage for this pattern is measured along line 554, which corresponds to line 524 of FIG. 5B. Along line 554, the two proximate shots form a single connected pattern 550. The left-most intersection of dosage curve 562 with threshold 564 at X-coordinate "c" determines the minimum X-coordinate of pattern 550 along line 554, as shown by connector 566. Similarly, the right-most intersection of dosage curve 562 with threshold 564 at X-coordinate "d" determines the maximum X-coordinate of pattern 550, as shown by connector 572. As can be seen, pattern 550 has a non-constant height in the Y-dimension, due to the use of a circular CP character for shot 520 and shot 522. FIGS. 5B&C illustrate how a plurality of proximate CP shots of a curvilinear CP character may together produce a single pattern on a resist-covered surface.

Figure 6A:
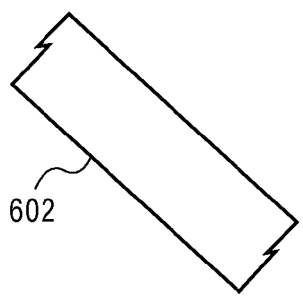
FIG. 6A illustrates a portion of a constant-width target pattern.
Figure 6B:
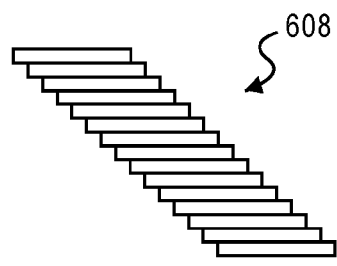
FIG. 6B illustrates a set of conventional non-overlapping shots which can form the pattern of FIG. 6A.

FIG. 6A illustrates an example of a portion of a desired pattern 602 to be formed on a resist-coated surface. Pattern 602 is a portion of a longer pattern, so the ends of the pattern are not shown. The edges of pattern 602 are not parallel to either axis of a Cartesian coordinate plane. Pattern 602 may, for example, be part of a metal interconnect layer on an integrated circuit. Pattern 602 is also a track or continuous track, where a track is a pattern that can be visualized geometrically as being formed with a single stroke of a paintbrush—i.e. a pattern with no branches. Unlike a normal paintbrush stroke, however, the width of a track may vary along its length. FIG. 6B illustrates the shot outlines 608 of a group of non-overlapping rectangular VSB shots, such as may be conventionally determined for forming pattern 602. Shot group 608 shows the shot outlines of 15 shots. The use of conventional non-overlapping shots may simplify determination of the pattern that the resist will register from the group of shots. Conventionally, a set of non-overlapping shots is determined such that the union of each of the shot outlines will equal the target pattern. The union of the shot outlines in the group of shots 608 does not quite equal the desired pattern 602 because the outline of pattern 602 cannot be matched exactly using rectangular shots which are oriented parallel to the axes of a Cartesian coordinate plane.

Figure 6C:
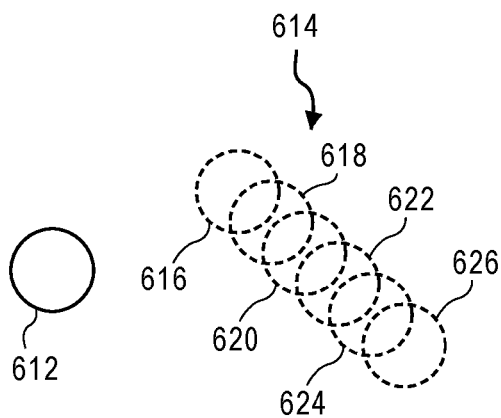
FIG. 6C illustrates a pattern which can be formed by a single circular CP shot, and also a set of six proximate CP shots.
Figure 6D:
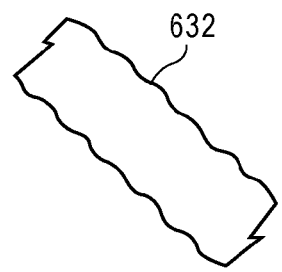
FIG. 6D illustrates a track which can be formed using the set of proximate CP shots from FIG. 6C.

FIGS. 6C-6F depict an exemplary method of the present disclosure wherein the target pattern 602 is formed using a series of curvilinear shots. FIG. 6C illustrates an example of a shot outline 612. In some embodiments, shot outline 612 may be produced using a circular CP character. In other embodiments, shot outline 612 may be a nearly-circular shot, such as a beamlet of a multi-beam charged particle beam system, or a shot of other curvilinear shapes. FIG. 6C also illustrates the shot outlines 614 of a group of shots which use the same character as pattern 612. The group of shots 614 comprises six shots: shot 616, shot 618, shot 620, shot 622, shot 624 and shot 626. In this example all the shots in shot group 614 use the same dosage, but shots using different dosages may also be used to form a track. The group of shots 614 forms a series, because the shots are in succession spatially, although the shots may be written on the surface in any temporal order. FIG. 6D illustrates a shape, the shape also being a track, that may be formed on a surface from the shots associated with shot series 614. The overlapping shot outlines in shot series 614 make the calculation of the resist response, and therefore the resulting pattern on the surface, more difficult than with shot group 608. Charged particle beam simulation may be used to determine the pattern 632 registered by the resist. In one embodiment, charged particle beam simulation may be used to calculate the dosage for each grid location in a two-dimensional (X and Y) grid, creating a grid of calculated dosages called a dosage map. The "wavy" edges in the registered pattern 632 result from using the spaced circular CP characters. The "waviness" of the edges causes variation in the width of the pattern 632. The width tolerance for a group of patterns is normally pre-determined. The width variation in pattern 632 can be reduced by spacing the circular CP shots more closely, which will increase the number of shots required to form the pattern. Since wider spacing of the circular CP shots can reduce the shot count and therefore the time to write the pattern, the pre-determined width tolerance can be used to determine the maximum acceptable spacing of the circular CP shots. An advantage of using circular CP shots for forming target patterns such as the target pattern 602 is that a circle is radially symmetrical. The effects of using a circular CP character are therefore similar irrespective of the angle of the target pattern. The pattern 632 illustrates how a series of curvilinear CP shots may be used to form a track on a surface, where the track is not parallel to an axis of a Cartesian coordinate plane.

Figure 6E:
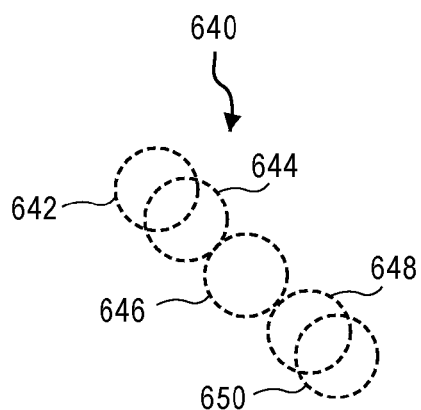
FIG. 6E illustrates a set of five proximate CP shots.
Figure 6F:
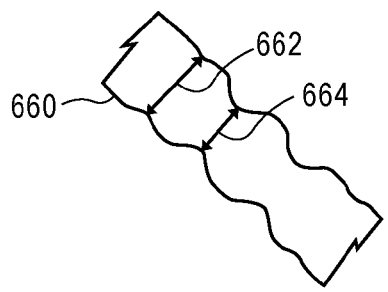
FIG. 6F illustrates a track which can be formed using the set of five proximate CP shots from FIG. 6E.

FIG. 6E illustrates another example of how a series of shots, in this case with some overlapping shots, may be used to form a pattern similar to the target pattern 602, using a circular CP character. Thus, FIGS. 6C and 6C illustrate that in various embodiments, shots in a subset of the plurality of charged particle beam shots overlap each other. FIG. 6E illustrates the shot outlines of a group of shots 640 which use the same character as pattern 612. Shot group 640 comprises five shots: shot 642, shot 644, shot 646, shot 648 and shot 650. As can be seen, the relative spacing of the shots in shot group 640 varies among the shots in the group. For example, the spacing between shot 642 and shot 644 is less than the spacing between shot 644 and shot 646. Similarly, the spacing between shot 650 and shot 648 is less than the spacing between shot 646 and shot 648. FIG. 6F illustrates a pattern 660 that may be formed on a resist-covered surface from shot group 640. The waviness of pattern 660 varies along its length because of the variable spacing of the shots in shot group 640. For example, the localized minimum width 662 in pattern 660 is due to the spacing between shot 642 and shot 644. The localized minimum width 664 in pattern 660 is due to the spacing between shot 644 and shot 646. The relatively larger spacing between shot 644 and shot 646 compared to the spacing between shot 642 and shot 644 results in a smaller width 664 compared to width 662. While use of a pre-determined width tolerance will normally suggest that the waviness of a single track be consistent to optimize the shot count, the example of FIG. 6E and FIG. 6F illustrates how a larger shot spacing, with no dosage or beam blur radius changes, can produce increased waviness in the resulting pattern on the surface. The pre-determined width tolerance for the final pattern on the surface may therefore be used to determine the maximum acceptable spacing of shots.

Referring again to FIG. 6C, it should be noted that although all shots in shot series 614 are made using the same character, tracks may be formed using a series of shots using a plurality of characters. In one embodiment, different sizes of circular CP characters may be used for different subsets of shots in a series of shots, producing a track of varying mean width. In another embodiment, a single CP character may be used for all shots in a series, but with different dosages for different subsets of shots in the series, also producing a track of varying mean width.

Figure 13A:
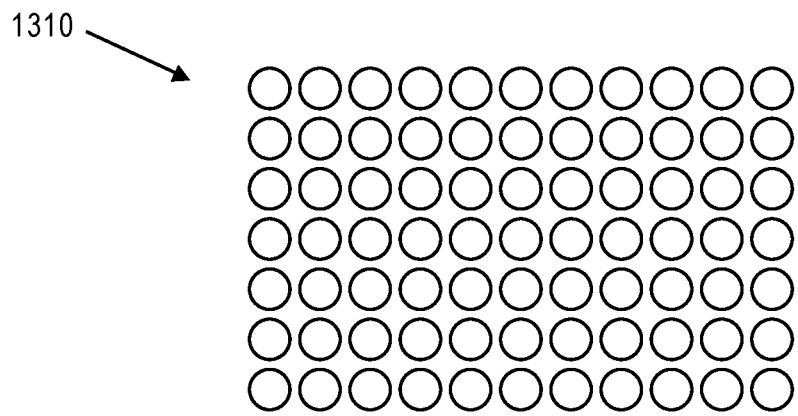
FIG. 13A illustrates an exemplary set of multi-beam beamlets.
Figure 13B:
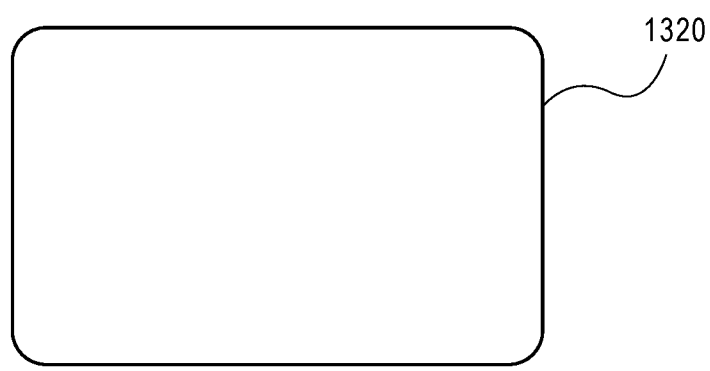
FIG. 13B illustrates a non-circular pattern formed by the set of beamlets of FIG. 13A.

FIGS. 13A-13B illustrate using a plurality of circular shots, such as a plurality of multi-beam beamlets, to form a non-circular pattern. FIG. 13A illustrates a group 1310 of circular or nearly-circular shots, such as beamlets. FIG. 13B illustrates a rectangular pattern 1320 formed by the set of shots in FIG. 13A. In this example, beamlets are non-overlapping. In other embodiments, multiple exposure passes may be used, where beamlets from one exposure pass partially overlap beamlets from a different exposure pass.

Figure 7A:
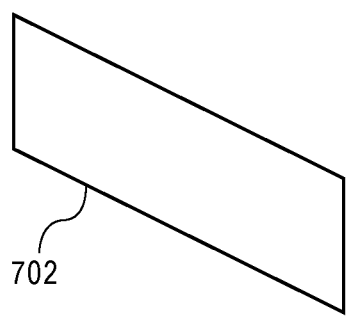
FIG. 7A illustrates an example of a target pattern comprising a parallelogram.
Figure 7B:
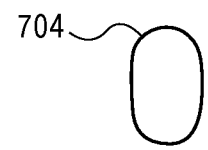
FIG. 7B illustrates a pattern that can be formed with a shot of an oval CP character.
Figure 7C:
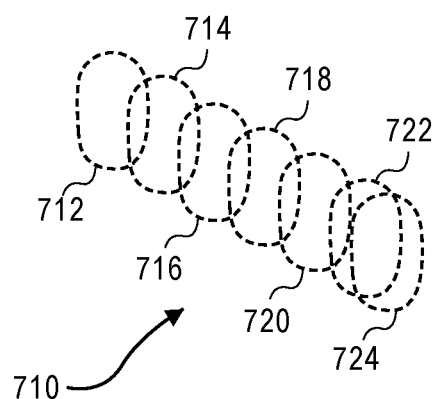
FIG. 7C illustrates a series of seven shots of the same oval CP character as FIG. 7B.
Figure 7D:
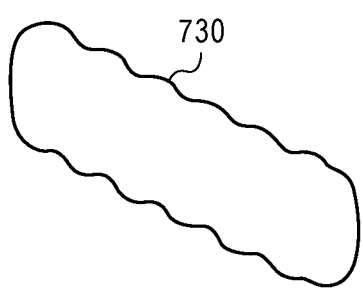
FIG. 7D illustrates a track which can be formed by the set of shots in FIG. 7C.

FIGS. 7A-7E depict another embodiment of the present disclosure in which an oval character is used. FIG. 7A illustrates an example of a desired pattern or track 702 to be formed on a resist-coated surface. The edges of track 702 are not parallel to either axis of a Cartesian coordinate plane. Track 702 may, for example, be part of a metal interconnect layer on an integrated circuit. FIG. 7B illustrates a shot outline 704 of an oval CP character. FIG. 7C illustrates the shot outlines of a series of CP shots 710 using the same oval character associated with shot outline 704. Shot series 710 consists of seven overlapping shots: shot 712, shot 714, shot 716, shot 718, shot 720, shot 722 and shot 724. The shots may be from a single or multi-beam charged particle beam system. As can be seen, the spacing between shot 722 and shot 724 is less than the spacing between other pairs of adjacent shots in shot series 710, so as to match the length of the track 702. FIG. 7D illustrates a track 730 that may be formed on a resist-coated surface from the shot series 710, using a normal—i.e. minimum—beam blur radius. Like track 632 above, the width of track 730 varies along its length. An advantage of using an oval CP character to form the shot series 710, compared to the circular CP character used to form the shot series 614, is that use of an oval shape results in a smaller area of overlap between adjacent shots compared to use of a circular shape. The smaller area of overlap between shots in shot series 710 lowers the dosage per unit area compared to shot series 614. This may be advantageous by producing a lower level of long range effects such as back scattering when the surface is exposed, compared to the shot series 614.

Figure 7E:
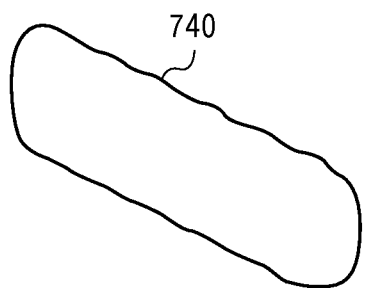
FIG. 7E illustrates another track which can be formed by the set of shots in FIG. 7C, using a higher-than-minimum beam blur radius.

FIG. 7E illustrates a track 740 that may be registered by the resist-coated surface from the shot series 710, when a higher-than-minimum beam blur is used. As can be seen, track 740 is smoother than track 730. Specifically, the difference between the maximum width and the minimum width of track 740 is less than the difference between the maximum width and the minimum width of track 730. The use of higher-than-minimum beam blur may allow the formation of tracks to a tighter—i.e. smaller—width tolerance than by using the minimum-available beam blur.

A series of curvilinear shots may also be used to form the perimeter of a pattern, as demonstrated in FIGS. 8A-8C. FIG. 8A illustrates an example of a curvilinear pattern 802 to be formed on a resist-coated surface. The pattern 802 may, for example, be the output of inverse lithography processing. The pattern 802 may be described as having four ears—one at each corner. Each ear has a radius of curvature 804, also marked "r". FIG. 8B illustrates the shot outlines of a series 820 of twelve circular shots that may be used to form the perimeter of pattern 802. The radius 824 of the outline of individual shots in the series of shots 820 is chosen to be "r", so as to form each of the ears of pattern 802 with a minimal shot count. FIG. 8C illustrates a track 840 that may be produced the series of shots 820. Track 840 is a closed track, with no start or end. The use of circular CP shots allows formation of the perimeter of track 840, which matches the perimeter of pattern 802 within a pre-determined tolerance, using fewer shots than if a set of rectangular VSB shots had been used. Additionally, the use of a circular CP character and dosage which can produce a pattern on the surface with a radius which closely matches the interior radius of a part of the target pattern can further reduce the shot count. The series 820 may be combined with additional shots to fill the interior of the pattern 840 to achieve the target pattern 802.

Figure 9B:
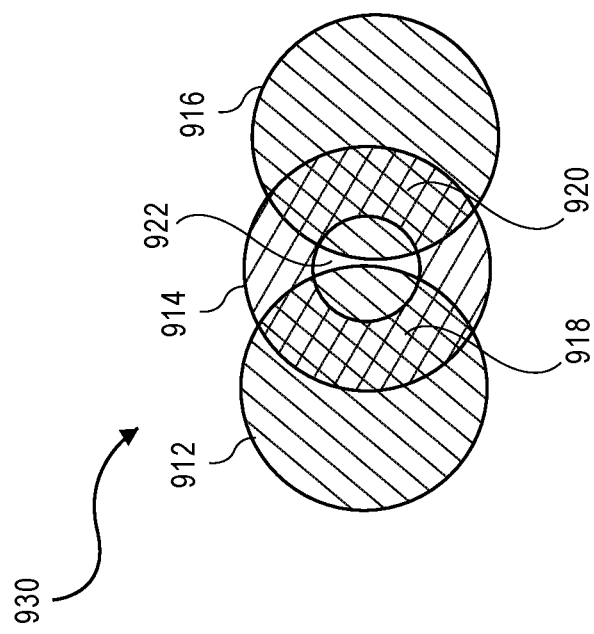
FIG. 9B illustrates a series of three CP shots, wherein two of the shots use a circular CP character and one of the shots uses an annular CP character.
Figure 9A:
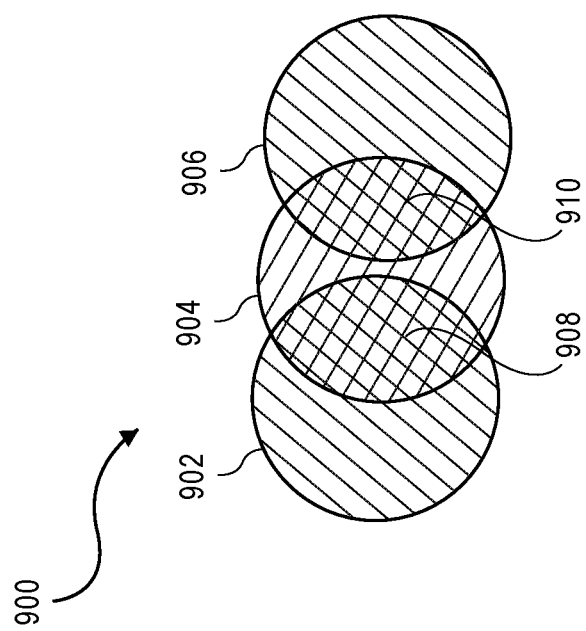
FIG. 9A illustrates a series of three circular CP shots which can form a track.

FIGS. 9A&B illustrate a comparison of the use of a circular CP character with use of an annular CP character in forming a track. FIG. 9A illustrates the shot outlines for an exemplary series of three shots 900, the combination of which will form a track. Shot series 900 comprises shot 902, shot 904 and shot 906, all of which are made using a circular CP character. The outline of the resulting track is not shown. Region 908 and region 910 are areas which will receive a dosage above a normal dosage, due to shot overlap. FIG. 9B illustrates the shot outlines for another exemplary series of three shots 930 which will also form a track. Shot series 930 comprises circular shot 912, annular shot 914, and circular shot 916. Region 918 and region 920 are the intersecting areas which will receive a dosage above a normal dosage, due to shot overlap. As can be seen, the area of region 918 is less than the area of region 908. Similarly, the area of region 920 is less than the area of region 910. This smaller area of region 918 compared to region 908 and region 920 compared to region 910 indicates that less overlap dosage will be delivered to the resist-coated surface in shot series 930 than in shot series 900. The lower dosage of the shot series 930 may be preferred so as to produce, for example, a lower level of backward scattering than the shot series 900. As is also shown in FIG. 9B, region 922, which is part of the "hole" in the outline of annular shot 914, may not register on the resist as a pattern, producing a void in the resulting track. Since the actual dosage received by any part of region 922 is the combination of dosages from shot 912, shot 914 and shot 916, particle beam simulation may be used to determine if the dosage in all parts of region 922 is above the threshold of the resist. If particle beam simulation results show that the dosage in some part of region 922 is below the resist threshold, an annular CP character with a smaller hole may be substituted for the annular shot, so that the pattern 922 has a smaller hole. Alternatively, the dosage of any combination of shots in the pattern may be slightly increased, such as increasing the dosage for circular shots 912 and 916. In yet other embodiments, for tracks which are straight tracks, an annular CP character with an elliptical or oval hole may be used, wherein the major or longer diameter of the hole is aligned with the direction of the track. Other more complex shapes may also be used for shot 914. The example of FIGS. 9A&B show how the use of annular CP shots may allow formation of tracks with overall lower dosage than circular or other non-annular curvilinear shots. Careful design can prevent voids in the formed patterns.

Note that curvilinear shapes referred to in this disclosure include but are not limited to circular, nearly circular, oval, nearly oval, elliptical, nearly elliptical, annular, nearly annular, oval-annular, nearly oval-annular, elliptically annular, or nearly elliptically annular.

The dosage that would be received by a surface can be calculated and stored as a two-dimensional (X and Y) dosage map called a glyph. A two-dimensional dosage map or glyph is a two-dimensional grid of calculated dosage values for the vicinity of the shots comprising the glyph. This dosage map or glyph can be stored in a library of glyphs. The glyph library can be used as input during fracturing of the patterns in a design. For example, referring again to FIGS. 7A&C, a dosage map may be calculated from the series of shots 710, and stored in the glyph library. If during fracturing, one of the input patterns is a pattern of the same shape as pattern 702, then the shots comprising the glyph may be retrieved from the library, avoiding the computational effort of determining an appropriate set of shots to form input pattern. A series of glyphs may also be combined to create a parameterized glyph. Parameters may be discrete or may be continuous. For example, the shots and dosage maps for forming patterns such as track 702 may be calculated for a plurality of pattern lengths, and the plurality of resulting glyphs may be combined to form a parameterized glyph.

Figure 10:
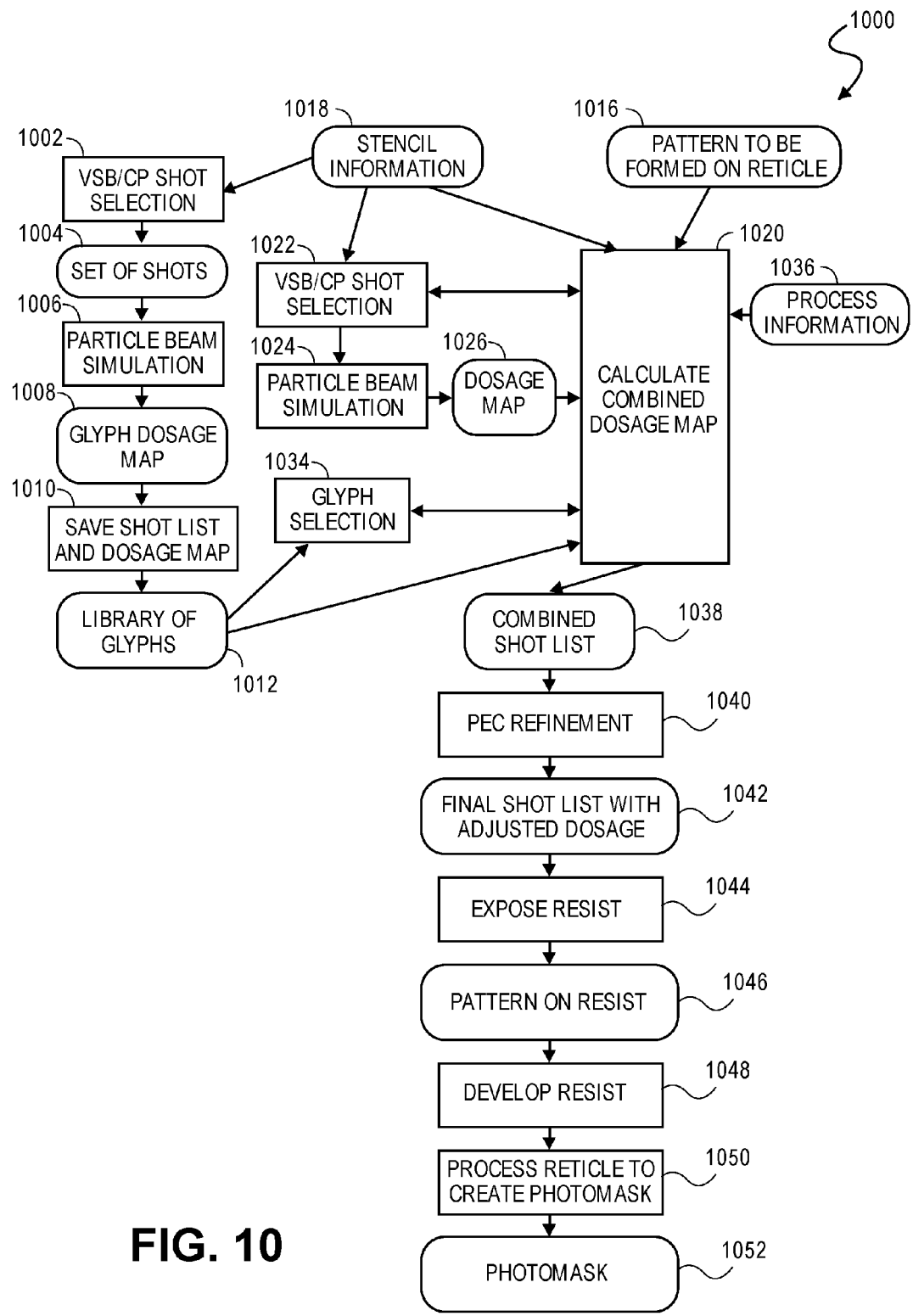
FIG. 10 illustrates a conceptual flow diagram for manufacturing a reticle or photomask using an exemplary method of the current disclosure.

FIG. 10 illustrates an exemplary conceptual flow diagram 1000 of a method for manufacturing a photomask according to the current disclosure. There are three types of input data to the process: stencil information 1018, which is information about the CP characters on the stencil of the charged particle beam system; process information 1036, which includes information such as the resist dosage threshold above which the resist will register a pattern; and a computer representation of the desired pattern 1016 to be formed on the reticle. In addition, initial optional steps 1002-1012 involve the creation of a library of glyphs. The first step in the optional creation of a library of glyphs is VSB/CP shot selection 1002, in which one or more VSB or CP shots, each shot with a specific dosage, are combined to create a set of shots 1004. The set of shots 1004 may include overlapping VSB shots and/or overlapping CP shots. The set of shots 1004 may include a series of curvilinear CP shots which will form a track. Shots in the set of shots may also have a beam blur specified. The VSB/CP shot selection step 1002 uses the stencil information 1018, which includes information about the CP characters that are available on the stencil. The set of shots 1004 is simulated in step 1006 using charged particle beam simulation to create a dosage map 1008 of the set of shots. Step 1006 may include simulation of various physical phenomena including forward scattering, resist diffusion, Coulomb effect, etching, fogging, loading, resist charging, and backward scattering. The result of step 1006 is a two-dimensional dosage map 1008 which represents the combined dosage from the set of shots 1004 at each of the grid positions in the map. The dosage map 1008 is called a glyph. In step 1010 the information about each of the shots in the set of shots, and the dosage map 1008 of this additional glyph is stored a library of glyphs 1012. In one embodiment, a set of glyphs may be combined into a type of glyph called a parameterized glyph.

The required portion of the flow 1000 involves creation of a photomask. In step 1020 a combined dosage map for the reticle or reticle portion is calculated. Step 1020 uses as input the desired pattern 1016 to be formed on the reticle, such as a non-circular target pattern to be formed on a surface. Step 1020 also uses as input the process information 1036, the stencil information 1018, and the glyph library 1012 if a glyph library has been created. In step 1020 an initial reticle dosage map may be created, into which the shot dosage maps will be combined. Initially, the reticle dosage map contains no shot dosage map information. In one embodiment, the grid squares of the reticle dosage map may be initialized with an estimated correction for long-range effects such as backscattering, fogging, or loading, a term which refers to the effects of localized resist developer depletion. Step 1020 may involve VSB/CP shot selection 1022, or glyph selection 1034, or both of these. Shot selection 1022 may comprise selecting a series of curvilinear CP shots which can form a track on the reticle. If a VSB or CP shot is selected, the shot is simulated using charged particle beam simulation in step 1024 and a dosage map 1026 of the shot is created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache. A higher-than-minimum beam blur may be specified for the VSB or CP shot. Both VSB and CP shots may be allowed to overlap, and may have varying dosages with respect to each other.

If a glyph is selected, the dosage map of the glyph is input from the glyph library. In step 1020, the various dosage maps of the shots and/or glyphs are combined into the reticle dosage map. In one embodiment, the combination is done by adding the dosages. Using the resulting combined dosage map and the process information 1036 containing resist characteristics, a reticle pattern may be calculated. If the calculated reticle pattern matches the desired pattern 1016 within a pre-determined tolerance, then a combined shot list 1038 is output, containing the determined VSB/CP shots and the shots constituting the selected glyphs. If the calculated reticle pattern does not match the target pattern 1016 within a predetermined tolerance as calculated in step 1020, the set of selected CP shots, VSB shots and/or glyphs is revised, the dosage maps are recalculated, and the reticle pattern is recalculated. In one embodiment, the initial set of shots and/or glyphs may be determined in a correct-by-construction method, so that no shot or glyph modifications are required. In another embodiment, step 1020 includes an optimization technique so as to minimize either the total number of shots represented by the selected VSB/CP shots and glyphs, or the total charged particle beam writing time, or some other parameter. In yet another embodiment, VSB/CP shot selection 1022 and glyph selection 1034 are performed so as to generate multiple sets of shots, each of which can form a reticle image that matches the desired pattern 1016, but at a lower-than-normal dosage, to support multi-pass writing.

The combined shot list 1038 comprises the determined list of selected VSB shots, selected CP shots and shots constituting the selected glyphs. All the shots in the final shot list 1038 include dosage information. Shots may also include a beam blur specification. In step 1040, proximity effect correction (PEC) and/or other corrections may be performed or corrections may be refined from earlier estimates. Thus, step 1040 uses the combined shot list 1038 as input and produces a final shot list 1042 in which the shot dosages have been adjusted. The group of steps from step 1020 through step 1042, or subsets of this group of steps, are collectively called fracturing or mask data preparation. The final shot list 1042 is used by the charged particle beam system in step 1044 to expose resist with which the reticle has been coated, thereby forming a pattern 1046 on the resist. In step 1048 the resist is developed. Through further processing steps 1050 the reticle is transformed into a photomask 1052.

Figure 14:
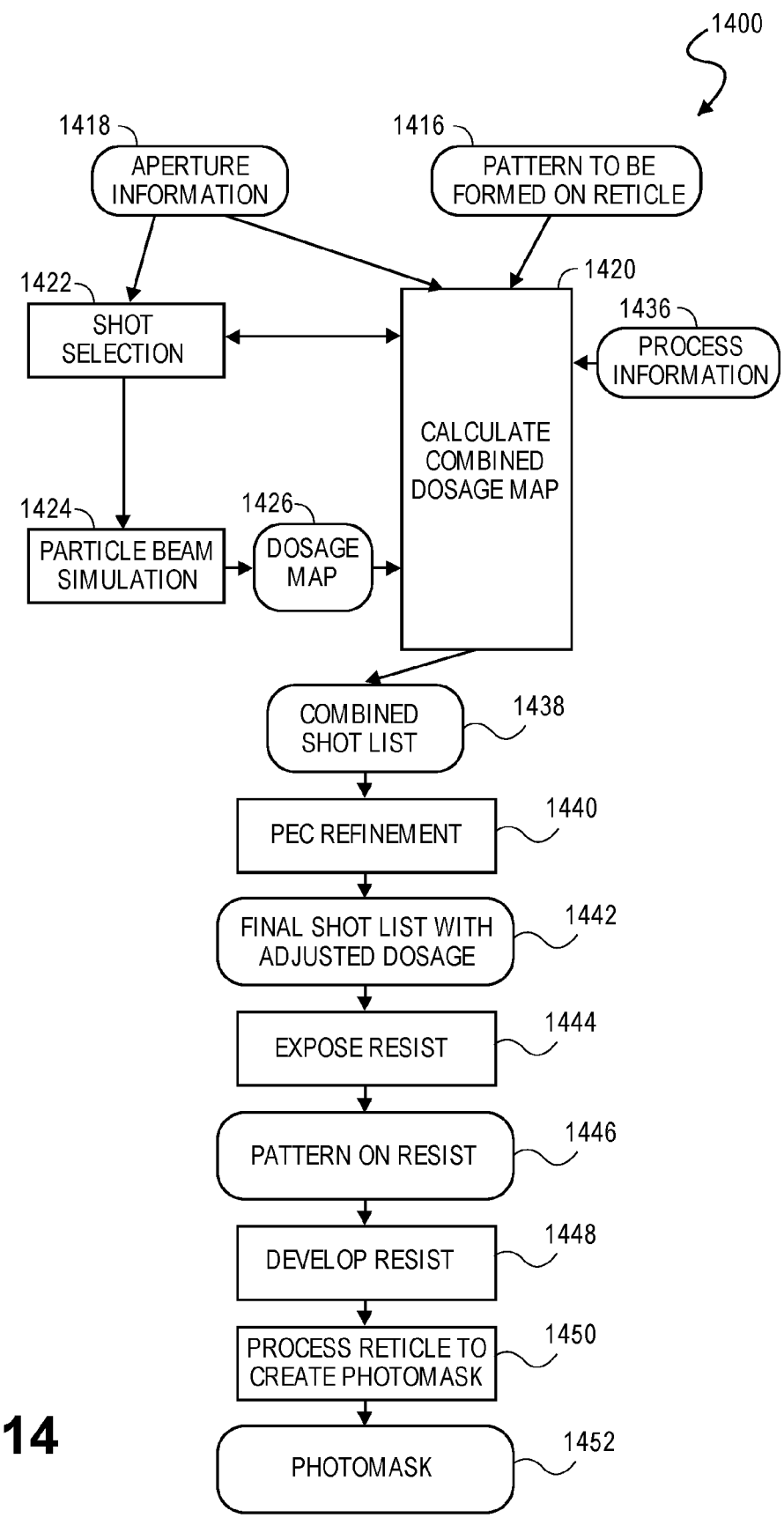
FIG. 14 illustrates a conceptual flow diagram for manufacturing a reticle or photomask using an exemplary method of the current disclosure, with a multi-beam charged particle beam exposure system.

FIG. 14 illustrates an exemplary conceptual flow diagram 1400 of a method for manufacturing a surface such as a photomask according to the current disclosure, using a multi-beam charged particle beam exposure system. Three types of input data are illustrated: aperture information 1418, which is information about the apertures 410 in the aperture plate 408 of FIG. 4, process information 1436, which includes information such as the resist dosage threshold above which the resist will register a pattern; and a computer representation of the desired pattern 1416 to be formed on the reticle. In some embodiments, apertures 410 may be circular, or may be nearly-circular. Step 1420 uses as input the desired pattern 1416 to be formed on the reticle, such as a non-circular target pattern to be formed on a surface. Step 1420 also uses as input the process information 1436, and the stencil information 1418. In step 1420 an initial reticle dosage map may be created, into which the shot dosage maps are combined. Initially, the reticle dosage map contains no shot dosage map information. In one embodiment, the grid squares of the reticle dosage map may be initialized with an estimated correction for long-range effects such as backscattering, fogging, or loading, a term which refers to the effects of localized resist developer depletion. Step 1420 includes shot selection 1422. Shot selection 1422 may comprise selecting a set of multi-beam shots, each shot comprising a plurality of beamlets, such as a plurality of circular or nearly-circular beamlets, which can form the target pattern 1416 on the reticle or other surface to which the pattern is being written. A shot in the set of multi-beam shots may be simulated using charged particle beam simulation in step 1424, and a dosage map 1426 of the shot created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache.

If the calculated substrate pattern matches the target pattern 1416 within a pre-determined tolerance, then a combined shot list 1438 is output in step 1420. The combined shot list 1438 comprises the determined list of multi-beam shots, each shot comprising a plurality of beamlets. Multi-beam shots may include dosage information, and dosage of different beamlets in the multi-beam shot may vary. In step 1440, proximity effect correction (PEC) and/or other corrections may be performed or corrections may be refined from earlier estimates. Thus, step 1440 uses the combined shot list 1438 as input and produces a final shot list 1442 in which the shot dosages have been adjusted. The group of steps from step 1420 through step 1442, or subsets of this group of steps, are collectively called fracturing or mask data preparation. The steps 1420-1438 are steps involved in determining the plurality of charged particle beam shots. The final shot list 1442 is used by the multi-beam charged particle beam system in step 1444 to expose resist with which the reticle has been coated, thereby forming a pattern 1446 on the resist. In some embodiments, step 1444 may comprise multiple exposure passes. In step 1448 the resist is developed. Through further processing steps 1450 the reticle is transformed into a photomask 1452.

Figure 11:
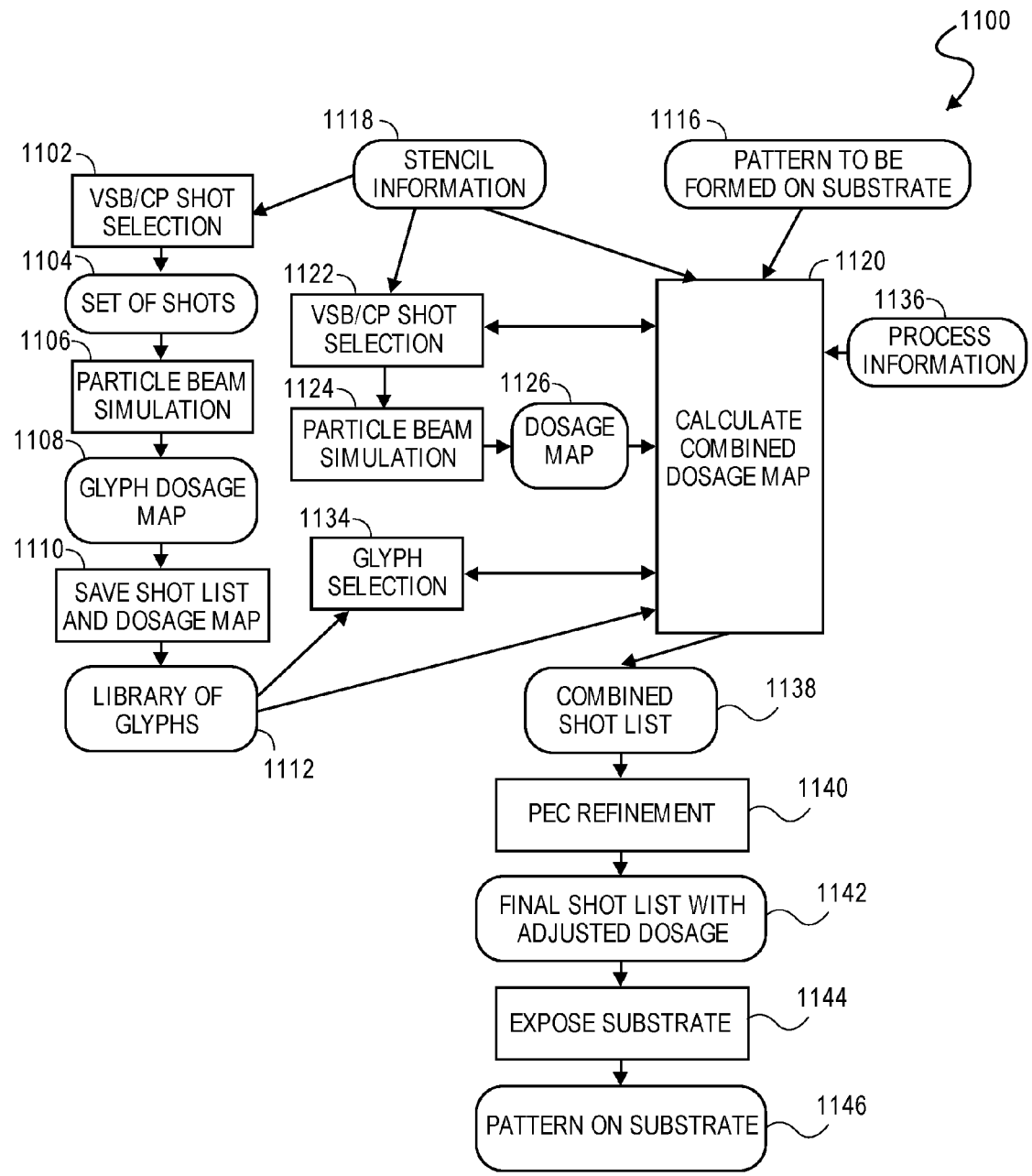
FIG. 11 illustrates a conceptual flow diagram for forming a pattern on a substrate using an exemplary method of the current disclosure.

FIG. 11 illustrates an exemplary conceptual flow diagram 1100 of a method for manufacturing a substrate such as a silicon wafer according to the current disclosure. The charged particle beam system for the method of FIG. 11 may be a system that writes a shape onto a surface using a single beam, or may be a multi-beam system that produces multiple beamlets. Thus a "shot" in the present methods may refer to either single or multi-beam shots. There are three types of input data to the process: stencil information 1118, which is information about the CP characters on the stencil of the charged particle beam system; process information 1136, which includes information such as the resist dosage threshold above which the resist will register a pattern; and a computer representation of the desired pattern 1116 to be formed on the substrate. In addition, initial optional steps 1102-1112 involve the creation of a library of glyphs. The first step in the optional creation of a library of glyphs is VSB/CP shot selection 1102, in which one or more VSB or CP shots, each shot with a specific dosage, are combined to create a set of shots 1104. The set of shots 1104 may include overlapping VSB shots and/or overlapping CP shots. The set of shots 1104 may include a series of curvilinear CP shots which will form a track. Shots in the set of shots may also have a beam blur specified. The VSB/CP shot selection step 1102 uses the stencil information 1118, which includes information about the CP characters that are available on the stencil. The set of shots 1104 is simulated in step 1106 using charged particle beam simulation to create a dosage map 1108 of the set of shots. Step 1106 may include simulation of various physical phenomena including forward scattering, resist diffusion, Coulomb effect, etching, fogging, loading, resist charging, and backward scattering. The result of step 1106 is a two-dimensional dosage map 1108 which represents the combined dosage from the set of shots 1104 at each of the grid positions in the map. The dosage map 1108 is called a glyph. In step 1110 the information about each of the shots in the set of shots, and the dosage map 1108 of this additional glyph is stored a library of glyphs 1112. In one embodiment, a set of glyphs may be combined into a type of glyph called a parameterized glyph.

The required portion of the flow 1100 involves creation of a pattern on a resist-covered substrate. In step 1120 a combined dosage map for the substrate or a portion of the substrate is calculated. Step 1120 uses as input the desired pattern 1116 to be formed on the substrate, the process information 1136, the stencil information 1118, and the glyph library 1112 if a glyph library has been created. In step 1120 an initial substrate dosage map may be created, into which the shot dosage maps will be combined. Initially, the substrate dosage map contains no shot dosage map information. In some embodiments, each shot in the plurality of shots comprises an assigned dosage, and wherein the assigned dosages of shots in the plurality of shots vary with respect to each other before dosage correction. In other embodiments, beamlets in the plurality of beamlets comprise assigned dosages, and wherein the assigned dosages of the beamlets vary with respect to each other before dosage correction. In one embodiment, the grid squares of the substrate dosage map may be initialized with an estimated correction for long-range effects such as backscattering, fogging, or loading. Step 1120 may involve VSB/CP shot selection 1122, or glyph selection 1134, or both of these. Shot selection 1122 may comprise selecting a series of curvilinear CP shots which can form a track on the substrate. If a VSB or CP shot is selected, the shot is simulated using charged particle beam simulation in step 1124 and a dosage map 1126 of the shot is created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache. A higher-than-minimum beam blur may be specified for the VSB or CP shot. Both VSB and CP shots may be allowed to overlap, and may have varying dosages with respect to each other. If a glyph is selected, the dosage map of the glyph is input from the glyph library. In step 1120, the various dosage maps of the shots and/or glyphs are combined into the substrate dosage map. In one embodiment, the combination is done by adding the dosages. Using the resulting combined dosage map and the process information 1136 containing resist characteristics, a substrate pattern may be calculated. If the calculated substrate pattern matches the desired pattern 1116 within a pre-determined tolerance, then a combined shot list 1138 is output, containing the determined VSB/CP shots and the shots constituting the selected glyphs. If the calculated substrate pattern does not match the target pattern 1116 within a predetermined tolerance as calculated in step 1120, the set of selected CP shots, VSB shots and/or glyphs is revised, the dosage maps are recalculated, and the substrate pattern is recalculated. In one embodiment, the initial set of shots and/or glyphs may be determined in a correct-by-construction method, so that no shot or glyph modifications are required. In another embodiment, step 1120 includes an optimization technique so as to minimize either the total number of shots represented by the selected VSB/CP shots and glyphs, or the total charged particle beam writing time, or some other parameter. In yet another embodiment, VSB/CP shot selection 1122 and glyph selection 1134 are performed so as to generate multiple sets of shots, each of which can form a reticle image that matches the desired pattern 1116, but at a lower-than-normal dosage, to support multi-pass writing.

The combined shot list 1138 comprises the determined list of selected VSB shots, selected CP shots and shots constituting the selected glyphs. All the shots in the final shot list 1138 include dosage information. Shots may also include a beam blur specification. In step 1140, proximity effect correction (PEC) and/or other corrections may be performed or corrections may be refined from earlier estimates. Thus, step 1140 uses the combined shot list 1138 as input and produces a final shot list 1142 in which the shot dosages have been adjusted. The group of steps from step 1120 through step 1142, or subsets of this group of steps, are collectively called fracturing or mask data preparation. The final shot list 1142 is used by the charged particle beam system in step 1144 to expose resist with which the substrate has been coated, thereby forming a pattern 1146 on the substrate. In some embodiments the surface is a reticle to be used in an optical lithography process to manufacture a substrate.

The fracturing, mask data preparation, and proximity effect correction flows described in this disclosure may be implemented using general-purpose computers using Central Processing Units (CPU) with appropriate computer software as computation devices. Due to the large amount of calculations required, multiple computers or processor cores of a CPU may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. Specialty computing hardware devices or processors may include, for example, field-programmable gate arrays (FPGA), application-specific integrated circuits (ASIC), or digital signal processor (DSP) chips. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

A system for manufacturing a surface using charged particle beam lithography according the present embodiments includes a device configured to input a non-circular target pattern to be formed on the surface, and a computation device configured to determine a plurality of charged particle beam shots that will form a pattern on the surface using a multi-beam charged particle beam system. Each charged particle beam shot is a multi-beam shot comprising a plurality of circular or nearly-circular beamlets. The pattern on the surface matches the target pattern within a pre-determined tolerance. In some embodiments, the multi-beam charged particle beam system comprises a charged particle beam source and an aperture plate, where the aperture plate comprises a plurality of apertures which the charged particle beam source illuminates. In some embodiments, each shot in the plurality of shots comprises an assigned dosage, where the assigned dosages of shots in the plurality of shots vary with respect to each other before dosage correction. In other embodiments, beamlets in the plurality of beamlets comprise assigned dosages, where the assigned dosages of the beamlets vary with respect to each other before dosage correction. In certain embodiments, the computation device comprises a calculation device configured to calculate the pattern that will be formed on the surface, where the calculation device may perform charged particle beam simulation.

Figure 12:
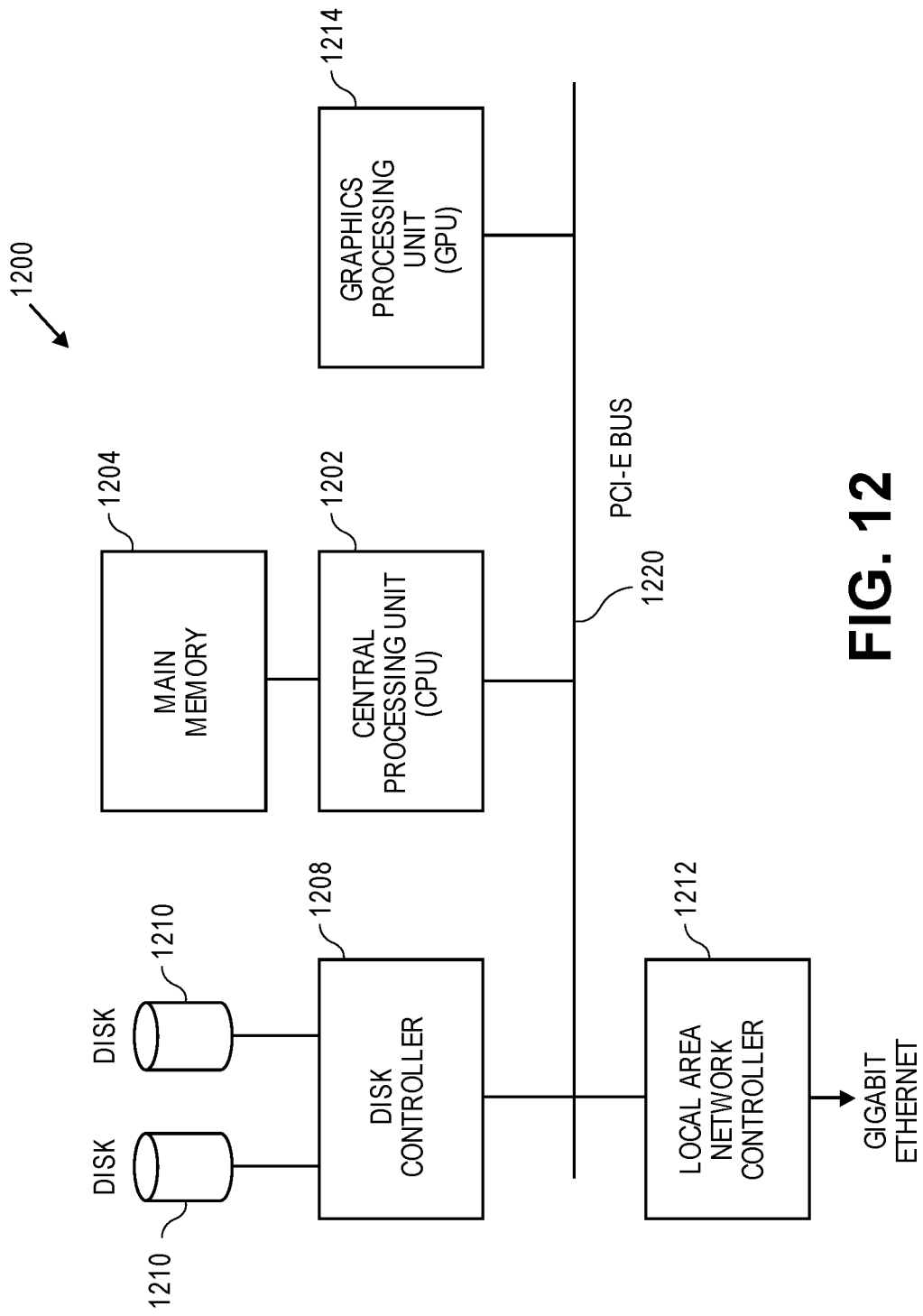
FIG. 12 illustrates an exemplary computing hardware device used in embodiments of the methods.

FIG. 12 illustrates an example of a computing hardware device 1200 that may be used to perform the calculations described in this disclosure. Computing hardware device 1200 comprises a central processing unit (CPU) 1202, with attached main memory 1204. The CPU may comprise, for example, eight processing cores, thereby enhancing performance of any parts of the computer software that are multi-threaded. The size of main memory 1204 may be, for example, 64 G-bytes. The CPU 1202 is connected to a Peripheral Component Interconnect Express (PCIe) bus 1220. A graphics processing unit (GPU) 1214 is also connected to the PCIe bus. In computing hardware device 1200 the GPU 1214 may or may not be connected to a graphics output device such as a video monitor. If not connected to a graphics output device, GPU 1214 may be used purely as a high-speed parallel computation engine. The computing software may obtain significantly-higher performance by using the GPU for a portion of the calculations, compared to using CPU 1202 for all the calculations. The CPU 1202 communicates with the GPU 1214 via PCIe bus 1220. In other embodiments (not illustrated) GPU 1214 may be integrated with CPU 1202, rather than being connected to PCIe bus 1220. Disk controller 1208 may also be attached to the PCIe bus, with, for example, two disks 1210 connected to disk controller 1208. Finally, a local area network (LAN) controller 1212 may also be attached to the PCIe bus, and provides Gigabit Ethernet (GbE) connectivity to other computers. In some embodiments, the computer software and/or the design data are stored on disks 1210. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, manufacturing a surface, and manufacturing an integrated circuit may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation, the method comprising:
inputting a non-circular target pattern to be formed on a surface;
determining a plurality of charged particle beam shots for a multi-beam charged particle beam system, wherein the plurality of shots will form a pattern on the surface, wherein each charged particle beam shot is a multi-beam shot comprising a plurality of circular or nearly-circular beamlets;
wherein the pattern on the surface matches the target pattern within a predetermined tolerance; and
wherein the determining is performed using a computing hardware device.

2. The method of claim 1 wherein the multi-beam charged particle beam system comprises a charged particle beam source and an aperture plate, wherein the aperture plate comprises a plurality of apertures which the charged particle beam source illuminates.

3. The method of claim 1 wherein shots in a subset of the plurality of charged particle beam shots overlap each other.

4. The method of claim 1 wherein the determining comprises calculating a calculated pattern that will be formed on the surface using the plurality of shots.

5. The method of claim 4 wherein the calculating comprises charged particle beam simulation.

6. The method of claim 5 wherein the charged particle beam simulation includes at least one of a group consisting of forward scattering, backward scattering, resist diffusion, Coulomb effect, etching, fogging, loading and resist charging.

7. A method for manufacturing a surface using charged particle beam lithography, the method comprising:
inputting a non-circular target pattern to be formed on the surface;
determining a plurality of charged particle beam shots for a multi-beam charged particle beam system, wherein the plurality of shots will form a pattern on the surface, wherein each charged particle beam shot is a multi-beam shot comprising a plurality of circular or nearly-circular beamlets, and wherein the pattern on the surface matches the target pattern within a predetermined tolerance; and
forming the pattern on the surface with the plurality of shots.

8. The method of claim 7 wherein the multi-beam charged particle beam system comprises a charged particle beam source and an aperture plate, wherein the aperture plate comprises a plurality of apertures which the charged particle beam source illuminates.

9. The method of claim 7 wherein shots in a subset of the plurality of charged particle beam shots overlap each other.

10. The method of claim 7 wherein each shot in the plurality of shots comprises an assigned dosage, and wherein the assigned dosages of shots in the plurality of shots vary with respect to each other before dosage correction.

11. The method of claim 7 wherein beamlets in the plurality of beamlets comprise assigned dosages, and wherein the assigned dosages of the beamlets vary with respect to each other before dosage correction.

12. The method of claim 7 wherein the determining comprises calculating a calculated pattern that will be formed on the surface using the plurality of shots.

13. The method of claim 12 wherein the calculating comprises charged particle beam simulation.

14. The method of claim 13 wherein the charged particle beam simulation includes at least one of a group consisting of forward scattering, backward scattering, resist diffusion, Coulomb effect, etching, fogging, loading and resist charging.

15. The method of claim 7 wherein the surface is a reticle to be used in an optical lithography process to manufacture a substrate.

16. A system for manufacturing a surface using charged particle beam lithography, the system comprising:
   a device configured to input a non-circular target pattern to be formed on the surface; and
   a computation device configured to determine a plurality of charged particle beam shots that will form a pattern on the surface using a multi-beam charged particle beam system, wherein each charged particle beam shot is a multi-beam shot comprising a plurality of circular or nearly-circular beamlets, and wherein the pattern on the surface matches the target pattern within a pre-determined tolerance.

17. The system of claim 16 wherein the multi-beam charged particle beam system comprises a charged particle beam source and an aperture plate, wherein the aperture plate comprises a plurality of apertures which the charged particle beam source illuminates.

18. The system of claim 16 wherein each shot in the plurality of shots comprises an assigned dosage, and wherein the assigned dosages of shots in the plurality of shots vary with respect to each other before dosage correction.

19. The system of claim 16 wherein beamlets in the plurality of beamlets comprise assigned dosages, and wherein the assigned dosages of the beamlets vary with respect to each other before dosage correction.

20. The system of claim 16 wherein the computation device comprises a calculation device configured to calculate the pattern that will be formed on the surface.

21. The system of claim 20 wherein the calculation device performs charged particle beam simulation.

* * * * *